(12) United States Patent
Choi

(10) Patent No.: US 11,309,043 B2
(45) Date of Patent: Apr. 19, 2022

(54) MEMORY DEVICE AND CONTROLLING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/082,591

(22) Filed: Oct. 28, 2020

(65) Prior Publication Data
US 2021/0391026 A1      Dec. 16, 2021

(30) Foreign Application Priority Data

Jun. 16, 2020   (KR) .................. 10-2020-0073162

(51) Int. Cl.
| | | |
|---|---|---|
| *G11C 16/24* | (2006.01) | |
| *G11C 16/34* | (2006.01) | |
| *G11C 16/08* | (2006.01) | |
| *G11C 16/10* | (2006.01) | |
| *G11C 7/10* | (2006.01) | |
| *G11C 16/30* | (2006.01) | |
| *G11C 16/26* | (2006.01) | |

(52) U.S. Cl.
CPC .......... *G11C 16/3459* (2013.01); *G11C 7/106* (2013.01); *G11C 7/1087* (2013.01); *G11C 16/08* (2013.01); *G11C 16/10* (2013.01); *G11C 16/26* (2013.01); *G11C 16/30* (2013.01)

(58) Field of Classification Search
CPC ... G11C 16/3459; G11C 7/106; G11C 7/1087; G11C 16/08; G11C 16/10; G11C 16/26; G11C 16/30
See application file for complete search history.

(56) References Cited

U.S. PATENT DOCUMENTS

2020/0321058 A1 *   10/2020   Lee ..................... G11C 16/10

FOREIGN PATENT DOCUMENTS

| KR | 10-2015-0090369 | 8/2015 |
|---|---|---|
| KR | 10-2016-0012300 | 2/2016 |

* cited by examiner

*Primary Examiner* — Xiaochun L Chen
(74) *Attorney, Agent, or Firm* — IP & T Group LLP

(57) ABSTRACT

The present disclosure relates to a memory device may include a plurality of memory cells coupled to a selected word line and to be programmed to one of first to n-th program states distinguished from each other based on threshold voltages thereof, a sensing latch storing data sensed from a bit line coupled to one memory cell, a pre-latch storing pre-verify information and a plurality of data latches storing data to be stored in the one memory cell, wherein at least one data latch stores main verify information on the main verify voltage during verify operations for the first program state to a threshold program state among the first to n-th program states until the verify operation for the threshold program state passes, and wherein the pre-latch stores the main verify information on the n-th program state after the verify operation for the threshold program state passes.

20 Claims, 17 Drawing Sheets

INFORMATION STORED IN LATCH BEFORE P4 PASS    1410

| FIRST LATCH | SECOND LATCH | THIRD LATCH | FOURTH LATCH | FIFTH LATCH |
|---|---|---|---|---|
| SENSING DATA +PRE-CHARGE DATA | PRE-VERIFY INFORMATION | Nth LSB+MAIN VERIFY INFORMATION | Nth CSB+MAIN VERIFY INFORMATION | Nth MSB+MAIN VERIFY INFORMATION |

INFORMATION STORED IN LATCH AFTER P4 PASS    1420

| FIRST LATCH | SECOND LATCH | THIRD LATCH | FOURTH LATCH | FIFTH LATCH | ← input |
|---|---|---|---|---|---|
| SENSING DATA +PRE-CHARGE DATA | PRE-VERIFY INFORMATION | Nth LSB+MAIN VERIFY INFORMATION | Nth CSB+MAIN VERIFY INFORMATION | N+1th LSB | |

INFORMATION STORED IN LATCH AFTER P5 PASS    1430

| FIRST LATCH | SECOND LATCH | THIRD LATCH | FOURTH LATCH | FIFTH LATCH | ← input |
|---|---|---|---|---|---|
| SENSING DATA +PRE-CHARGE DATA | PRE-VERIFY INFORMATION | N+1th LSB | Nth CSB +MAIN VERIFY INFORMATION | N+1th CSB | |

INFORMATION STORED IN LATCH AFTER P6 PASS    1440

| FIRST LATCH | SECOND LATCH | THIRD LATCH | FOURTH LATCH | FIFTH LATCH | ← input |
|---|---|---|---|---|---|
| SENSING DATA +PRE-CHARGE DATA | MAIN VERIFY INFORMATION | N+1th LSB | N+1th CSB | N+1th MSB | |

MEMORY DEVICE AND CONTROLLING METHOD THEREOF

CROSS-REFERENCE TO RELATED APPLICATION

The present application claims priority under 35 U.S.C. § 119(a) to Korean patent application number 10-2020-0073162 Filed on Jun. 16, 2020, in the Korean Intellectual Property Office, the entire disclosure of which is incorporated by reference herein.

BACKGROUND

1. Technical Field

Various embodiments relate generally to a memory device, and more particularly, to a memory device including a page buffer and a method of controlling the memory device.

2. Related Art

A storage device may store data in response to control of a host device such as a computer or a smartphone. A storage device may include a memory device storing data and a memory controller controlling the memory device. Generally, there are two types of memory devices: volatile memory devices and non-volatile memory devices.

A volatile memory device may retain data as long as power is being supplied, and may lose the stored data in the absence of power supply. Examples of volatile memory devices include Static Random Access Memory (SRAM), Dynamic Random Access Memory (DRAM), and the like.

A non-volatile memory device may retain data even in the absence of power supply. Examples of non-volatile memory devices include Read Only Memory (ROM), Programmable ROM (PROM), Electrically Programmable ROM (EPROM), Electrically Erasable and Programmable ROM (EEPROM) and flash memory.

SUMMARY

Various embodiments of the present disclosure are directed to a memory device including a limited number of cache latches and performing an improved cache program operation, and a method of controlling the memory device.

According to an embodiment, a memory device may include a plurality of memory cells coupled to a selected word line and to be programmed to one of first to n-th program states distinguished from each other based on threshold voltages thereof, where n is a natural number greater than 1, a sensing latch storing data sensed from a bit line coupled to one memory cell among the plurality of memory cells, a pre-latch storing pre-verify information indicating whether or not to apply a pre-verify voltage having a lower potential level than a main verify voltage to the selected word line during verify operations for the first to n-th program states and a plurality of data latches storing data to be stored in the one memory cell, wherein at least one data latch among the plurality of data latches stores main verify information on the main verify voltage during verify operations for the first program state to a threshold program state among the first to n-th program states until the verify operation for the threshold program state passes, and wherein the pre-latch stores the main verify information on the n-th program state after the verify operation for the threshold program state passes.

According to an embodiment, a memory device, may include a plurality of memory cells coupled to a selected word line and to be programmed to one of first to n-th program states distinguished from each other based on threshold voltages thereof, where n is a natural number greater than 1, a sensing latch storing data sensed from a bit line coupled to one memory cell among the plurality of memory cells, a pre-latch storing pre-verify information indicating whether or not to apply a pre-verify voltage having a lower potential level than a main verify voltage to the selected word line during verify operations for the first to n-th program states, a plurality of data latches storing data to be stored in the one memory cell and a control logic storing, in at least one data latch among the plurality of data latches, main verify information on the main verify voltage during verify operations for the first program state to a threshold program state among the first to n-th program states until the verify operation for the threshold program state passes and storing, in the pre-latch, the main verify information on the n-th program state after the verify operation for the threshold program state passes.

According to an embodiment, an operating method of a memory device, the operating method may include latching, in a pre-latch, pre-verify information on first to (n−1)th program states of memory cells during a pre-verify operation for the first to (n−1)th program states of the memory cells, latching, in one or more data latches, main verify information on the first to (n−1)th program states until a main verify operation for the first to (n−1)th program states passes, latching, in the pre-latch, the main verify information on the n-th program state during the main verify operation for the n-th program state without performing the pre-verify operation for the n-th program state after the main verify operation for the first to (n−1)th program states passes, and pre-charging one or more bit lines coupled to the memory cells based on the main verify information latched in the pre-latch, wherein the memory cells are coupled to a word line and to be programmed one of to the first to n-th program states.

DETAILED DESCRIPTION

Hereinafter, specific structural and functional description is provided in the context of embodiments of the present disclosure. The invention, however, may be implemented in various forms and carried out in various ways. Thus, the invention is not limited to any of the disclosed embodiments nor to any specific detail provided herein.

Embodiments of the present disclosure are described in detail below with reference to the accompanying drawings to enable those skilled in the art to practice and readily implement the invention. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

Figure 1:
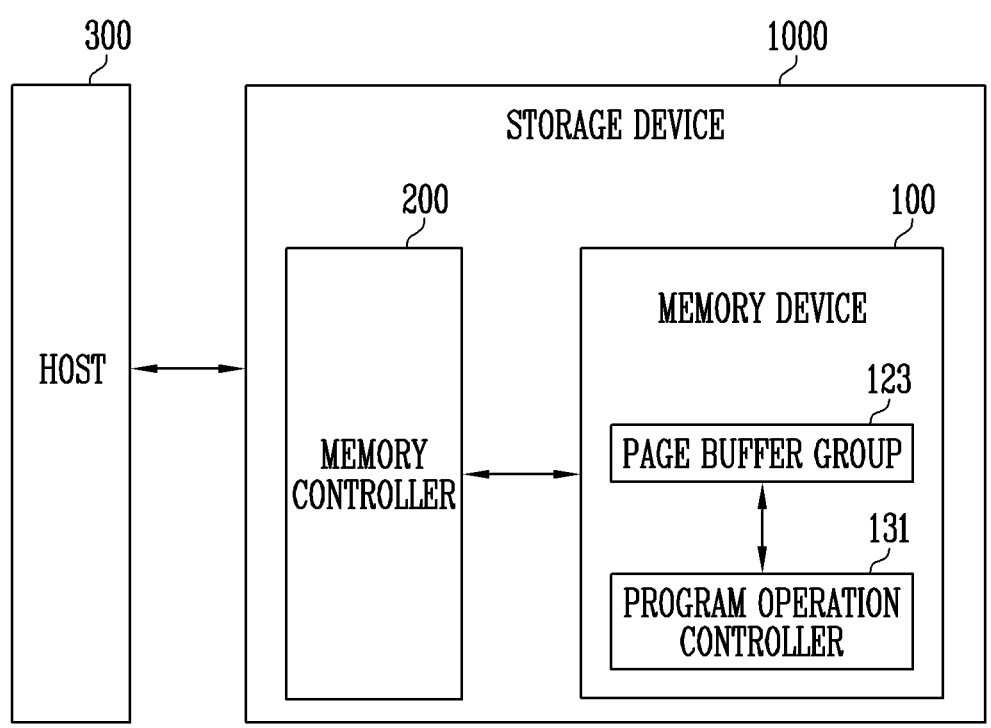
FIG. 1 is a block diagram illustrating a storage device according to an embodiment of the present disclosure.

FIG. 1 is a block diagram illustrating a storage device 1000 according to an embodiment of the present disclosure.

Referring to FIG. 1, the storage device 1000 may include a memory device 100 and a memory controller 200.

The storage device 1000 may be configured to store data in response to control of a host 300. Examples of the storage device 1000 include a cellular phone, a smartphone, an MP3 player, a laptop computer, a desktop computer, a game player, a display device, a tablet PC, and an in-vehicle infotainment system.

The storage device 1000 may be manufactured or configured as any of various types of storage devices according to a host interface corresponding to a communication method with the host 300. For example, the storage device 1000 may be configured as any of a solid state drive (SSD), a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a Personal Computer Memory Card International Association (PCMCIA) card type storage device, a peripheral component interconnection (PCI) card type storage device, a PCI express (PCI-E) card type storage device, a compact flash (CF) card, a smart media card, and a memory stick.

The storage device 1000 may be manufactured as any of various types of packages. For example, the storage device 1000 may be manufactured as any of a package-on-package (POP), a system-in-package (SIP), a system-on-chip (SOC), a multi-chip package (MCP), a chip-on-board (COB), a wafer-level fabricated package (WFP), and a wafer-level stack package (WSP).

The memory device 100 may store data or utilize stored data. More specifically, the memory device 100 may operate in response to control of the memory controller 200. In addition, the memory device 100 may include a plurality of memory dies, each of which includes a memory cell array including a plurality of memory cells storing data.

Each of the memory cells may be a single level cell (SLC) storing one data bit, a multi-level cell (MLC) storing two data bits, a triple level cell (TLC) storing three data bits, or a quad level cell (QLC) storing four data bits.

The memory cell array may include a plurality of memory blocks. Each of the memory blocks may include a plurality of memory cells. Each memory block may include a plurality of pages. A page may be a unit for storing data in the memory device 100, or a unit for reading data stored in the memory device 100.

Examples of the memory device 100 include Double Data Rate Synchronous Dynamic Random Access Memory (DDR SDRAM), Low Power Double Data Rate4 (LPDDR4) SDRAM, Graphics Double Data Rate (GDDR) SDRAM, Low Power DDR (LPDDR) SDRAM, Rambus Dynamic Random Access Memory (RDRAM), NAND flash memory, vertical NAND flash memory, NOR flash memory device, resistive random access memory (RRAM), phase-change random access memory (PRAM), magnetoresistive random access memory (MRAM), ferroelectric random access memory (FRAM), or spin transfer torque random access memory (STT-RAM). By way of example, it is assumed in the description below that the memory device 100 is a NAND flash memory.

The memory device 100 may receive a command and an address from the memory controller 200. The memory device 100 may be configured to access an area selected in response to the received address in the memory cell array. When the memory device 100 accesses the selected area, the memory device 100 may perform an operation corresponding to the received command on the selected area. For example, the memory device 100 may perform a write operation (program operation), a read operation, and an erase operation. A program operation may refer to an operation by which the memory device 100 writes data to the area selected by the address. A read operation may refer to an operation by which the memory device 100 reads data from the area selected by the address. An erase operation may refer to an operation by which the memory device 100 erases the data stored in the area selected by the address.

Each of the plurality of memory dies included in the memory device 100 may include at least one memory cell array. In addition, the plurality of memory dies may be controlled by a die interleaving operation, a channel interleaving operation, a way interleaving operation, or a plane interleaving operation.

According to an embodiment, the memory device 100 may include a page buffer group 123 and a program operation controller 131.

The page buffer group 123 may temporarily store data to be programmed into the memory cell included in the memory device 100, store pre-charge data for determining a potential to be pre-charged to a bit line coupled to the memory cell, or sense data stored in the memory cell and store the sensed data. The page buffer group 123 may temporarily store data to be programmed into another page for a cache program operation. More specifically, while data is programmed into the current page, the page buffer group 123 may temporarily store data to be programmed into the next page. The current page may correspond to memory cells coupled to a selected word line. The next page may correspond to memory cells coupled to a word line to be selected next.

The program operation controller 131 may control the page buffer group 123 and a peripheral circuit 120 so that the data temporarily stored in the page buffer group 123 may be programmed into the memory device 100. More specifically, the program operation controller 131 may control the peripheral circuit 120 to identify a program state of memory cells coupled to the selected word line and to store data to be stored in memory cells coupled to the next selected word line in the page buffer group 123 according to the identified program state.

The memory controller 200 may execute firmware FW when power is applied to the storage device 1000. The firmware FW may include a host interface layer (HIL) receiving a request input from the host 300 or outputting a response to the host 300, a flash translation layer (FTL) managing operations between an interface of the host 300 and an interface of the memory device 100, and a flash interface layer (FIL) providing a command to the memory device 100 or receiving a response from the memory device 100.

The memory controller 200 may receive data and a logical address LA from the host 300 and convert the logical address LA into a physical address PA indicating an address of memory cells where the data is stored in the memory device 100. The logical address may be a logical block address LBA and the physical address may be a physical block address PBA.

For example, the memory controller 200 may control the memory device 100 so that a program operation, a read operation or an erase operation may be performed in response to a request from the host 300. During a program operation, the memory controller 200 may provide a program command, a physical block address, and data to the memory device 100. During a read operation, the memory controller 200 may provide a read command and a physical block address to the memory device 100. During an erase operation, the memory controller 200 may provide an erase command and a physical block address to the memory device 100.

The memory controller 200 may control the memory device 100 so that a program operation, a read operation or an erase operation may be performed without a request from the host 300. For example, the memory controller 200 may control the memory device 100 to perform a program operation, a read operation, or an erase operation used to perform background operations such as wear leveling, garbage collection and read reclaim.

The memory controller 200 may provide a cache program command to the memory device 100. When the memory device 100 receives the cache program command, the program operation controller 131 may control the page buffer group 123 so that data to be programmed to the next page may be stored in the page buffer group 123 while the current page is being programmed with data.

The host 300 may communicate with the storage device 1000 using at least one of various communication methods, such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and/or Load Reduced DIMM (LRDIMM) communication methods.

Figure 2:
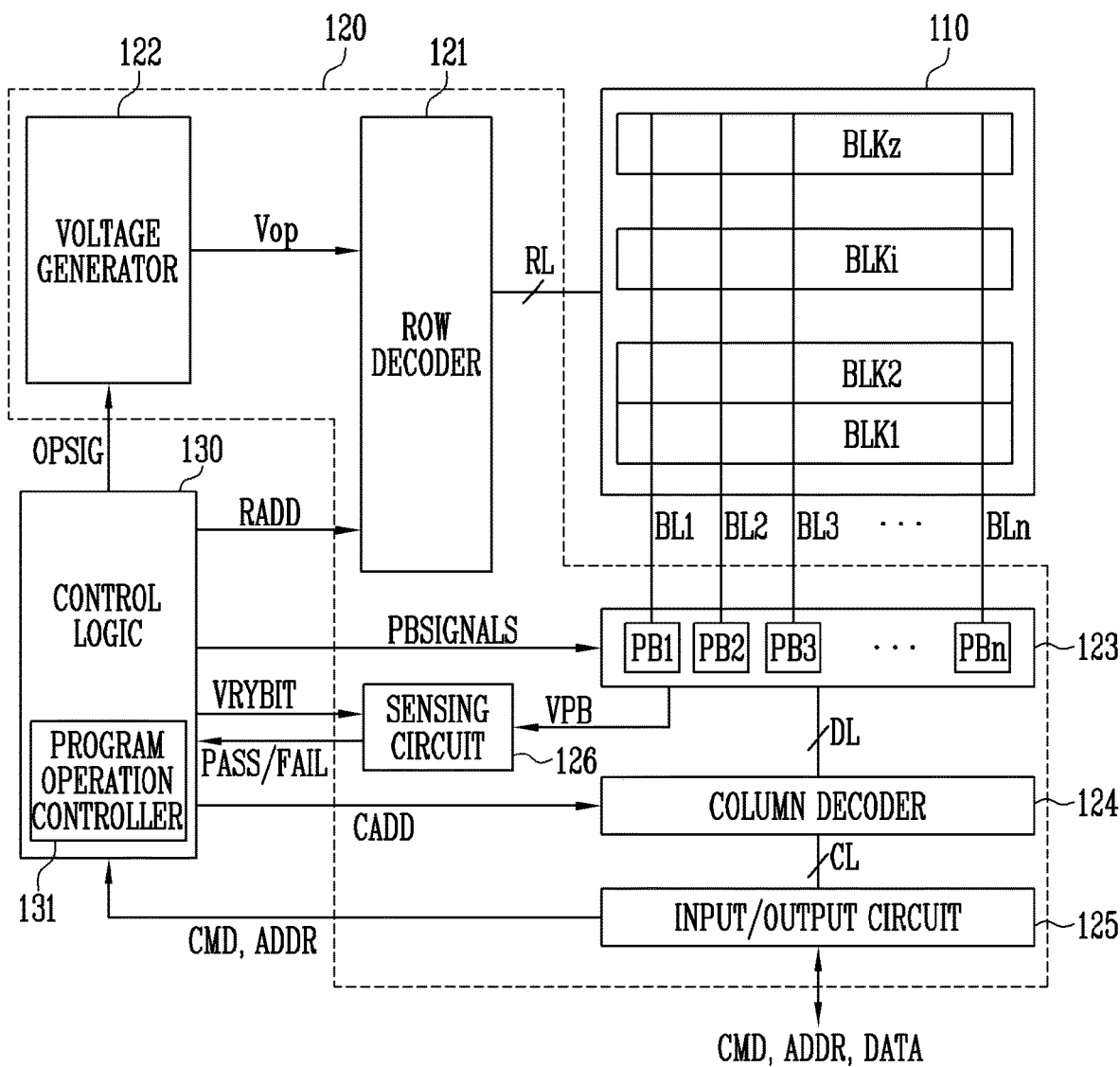
FIG. 2 is a block diagram illustrating a memory device according to an embodiment of the present disclosure.

FIG. 2 is a block diagram illustrating the memory device 100 according to an embodiment of the present disclosure.

Referring to FIG. 2, the memory device 100 may include a memory cell array 110, a peripheral circuit 120, and control logic 130.

The memory cell array 110 includes a plurality of memory blocks BLK1 to BLKz, which may be coupled to a row decoder 121 through row lines RL. The plurality of memory blocks BLK1 to BLKz may be coupled to the page buffer group 123 through bit lines BL1 to BLn. Each of the plurality of memory blocks BLK1 to BLKz may include a plurality of memory cells. According to an embodiment, the plurality of memory cells may be non-volatile memory cells. Memory cells coupled to the same word line may be defined as one page. Therefore, each memory block may include a plurality of pages.

The row lines RL may include at least one source select line, a plurality of word lines, and at least one drain select line.

Each of the memory cells included in the memory cell array 110 may be a single-level cell (SLC) storing a single data bit, a multi-level cell (MLC) storing two data bits, a triple-level cell (TLC) storing three data bits, or a quad-level cell (QLC) storing four data bits.

The peripheral circuit 120 may be configured to perform program, read and erase operations on the selected area of the memory cell array 110 in response to control of the control logic 130. In other words, the peripheral circuit 120 may drive the memory cell array 110 in response to the control logic 130. For example, the peripheral circuit 120 may apply various operating voltages to the row lines RL and the bit lines BL1 to BLn or discharge the applied voltages in response to control of the control logic 130.

More specifically, the peripheral circuit 120 may include the row decoder 121, a voltage generator 122, the page buffer group 123, a column decoder 124, and an input/output circuit 125.

The row decoder 121 may be coupled to the memory cell array 110 through the row lines RL. The row lines RL may include at least one source select line, a plurality of word lines, and at least one drain select line. According to an embodiment, the word lines may include normal word lines and dummy word lines. In addition, the row lines RL may further include a pipe select line.

The row decoder 121 may be configured to operate in response to control of the control logic 130. The row decoder 121 may receive a row address RADD from the control logic 130. More specifically, the row decoder 121 may be configured to decode the row address RADD. The row decoder 121 may select at least one memory block among the memory blocks BLK1 to BLKz according to the decoded address. The row decoder 121 may select at least one word line of the selected memory block so as to apply voltages generated by the voltage generator 122 to at least one word line according to the decoded address.

For example, during a program operation, the row decoder 121 may apply a program voltage to the selected word line and a program pass voltage having a lower voltage level than the program voltage to unselected word lines.

During a program verify operation, the row decoder 121 may apply a verify voltage to the selected word line and a verify pass voltage greater than the verify voltage to the unselected word lines. During a read operation, the row decoder 121 may apply a read voltage to the selected word line and a read pass voltage greater than the read voltage to the unselected word lines.

According to an embodiment, an erase operation of the memory cell array 110 may be performed in unit of memory blocks. During an erase operation, the row decoder 121 may select one of the memory blocks according to the decoded address, and the row decoder 121 may apply a ground voltage to word lines coupled to the selected memory block.

The voltage generator 122 may operate in response to control of the control logic 130. More specifically, the voltage generator 122 may be configured to generate a plurality of voltages by using an external power voltage supplied to the memory device 100 in response to the control logic 130. For example, the voltage generator 122 may generate a program voltage, a verify voltage, a pass voltage, a read voltage, and an erase voltage in response to the control of the control logic 130. In other words, the voltage generator 122 may generate various operating voltages Vop for program, read and erase operations in response to an operation signal OPSIG.

According to an embodiment, the voltage generator 122 may generate an internal power voltage by regulating the external power voltage. The internal power voltage generated by the voltage generator 122 may serve as an operating voltage of the memory cell array 110.

According to an embodiment, the voltage generator 122 may generate a plurality of voltages by using the external power voltage or the internal power voltage. For example, the voltage generator 122 may include a plurality of pumping capacitors receiving the internal power voltage and generate a plurality of voltages by selectively activating the plurality of pumping capacitors in response to the control of the control logic 130. The plurality of generated voltages may be supplied to the memory cell array 110 by the row decoder 121.

The page buffer group 123 may include first to n-th page buffers PB1 to PBn, which may be coupled to the memory cell array 110 through the first to n-th bit lines BL1 to BLn, respectively. The first to n-th page buffers PB1 to PBn may operate in response to the control of the control logic 130. More specifically, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense voltages or currents in the first to n-th bit lines BL1 to BLn during a read or verify operation.

More specifically, during a program operation, the first to n-th page buffers PB1 to PBn may transfer data DATA received through the input/output circuit 125 to selected memory cells through the first to n-th bit lines BL1 to BLn when a program pulse is applied to a selected word line. Memory cells of the selected page may be programmed according to the transferred data DATA. A memory cell coupled to a bit line to which a program permission voltage (e.g., a ground voltage) is applied may have an increased threshold voltage. A threshold voltage of a memory cell coupled to a bit line to which a program inhibition voltage (for example, a power voltage) is applied may be maintained.

During a program verify operation, the first to n-th page buffers PB1 to PBn may read page data from the selected memory cells through the first to n-th bit lines BL1 to BLn, respectively.

During a read operation, the first to n-th page buffers PB1 to PBn may read the data DATA from the memory cells of the selected page through the first to n-th bit lines BL1 to BLn and may output the read data DATA to the input/output circuit 125 in response to control of the column decoder 124.

During an erase operation, the first to n-th page buffers PB1 to PBn may float the first to n-th bit lines BL1 to BLn.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer a command CMD and an address ADD from the memory controller 200 to the control logic 130, or may exchange the data DATA with the column decoder 124.

A sensing circuit 126 may generate a reference current in response to an allowable bit signal VRYBIT and compare a sensing voltage VPB received from the page buffer group 123 with a reference voltage generated by the reference current to output a pass signal PASS or a fail signal FAIL during a read operation or a verify operation.

The control logic 130 may control the peripheral circuit 120 by outputting the operation signal OPSIG, the row address RADD, the page buffer control signals PBSIGNALS and the allowable bit signal VRYBIT in response to the command CMD and the address ADD. In addition, the control logic 130 may determine whether a verify operation passes or fails in response to the pass or fail signal PASS or FAIL. Verify information including the pass or fail signal PASS or FAIL may be temporarily stored in the page buffer group 123. The program operation controller 131 may perform a program operation on the basis of the verify information. According to an embodiment, the program operation controller 131 may determine a program state of a memory cell in response to the pass or fail signal PASS or FAIL. For example, when a memory cell operates as a triple level cell (TLC), the program operation controller 131 may determine whether the program state of the memory cell is an erase state E or one of the first to seventh program states P1 to P7.

Figure 3:
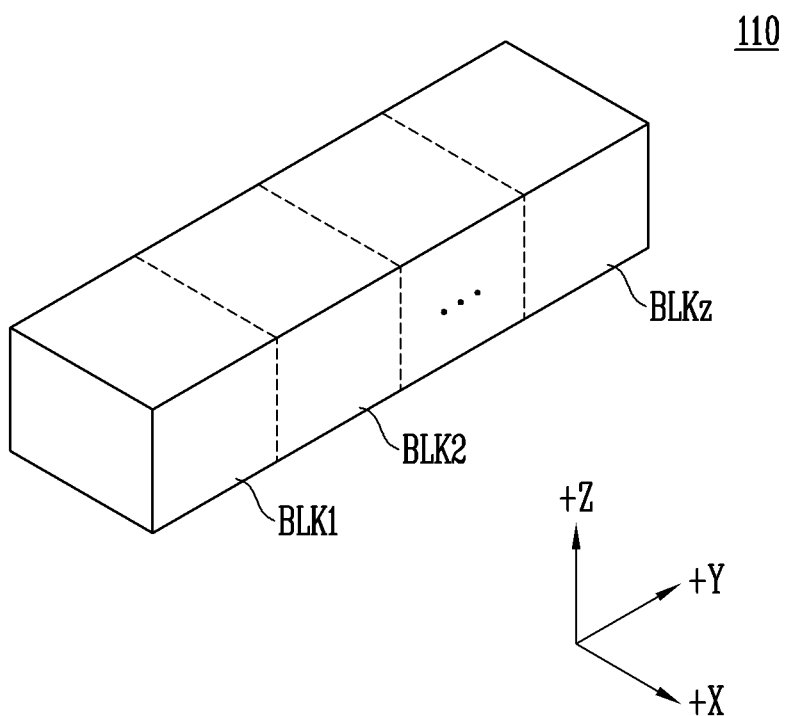
FIG. 3 is a block diagram illustrating a memory cell array according to an embodiment of the present disclosure.

FIG. 3 is a block diagram illustrating the memory cell array 110 according to an embodiment of the present disclosure.

Referring to FIG. 3, the memory cell array 110 may include the plurality of memory blocks BLK1 to BLKz. Each memory block may have a three-dimensional structure and include a plurality of memory cells stacked over a substrate. The plurality of memory cells may be arranged in +X direction, +Y direction and +Z direction. The structure of each memory block is described below in more detail with reference to FIGS. 4 to 6.

Figure 4:
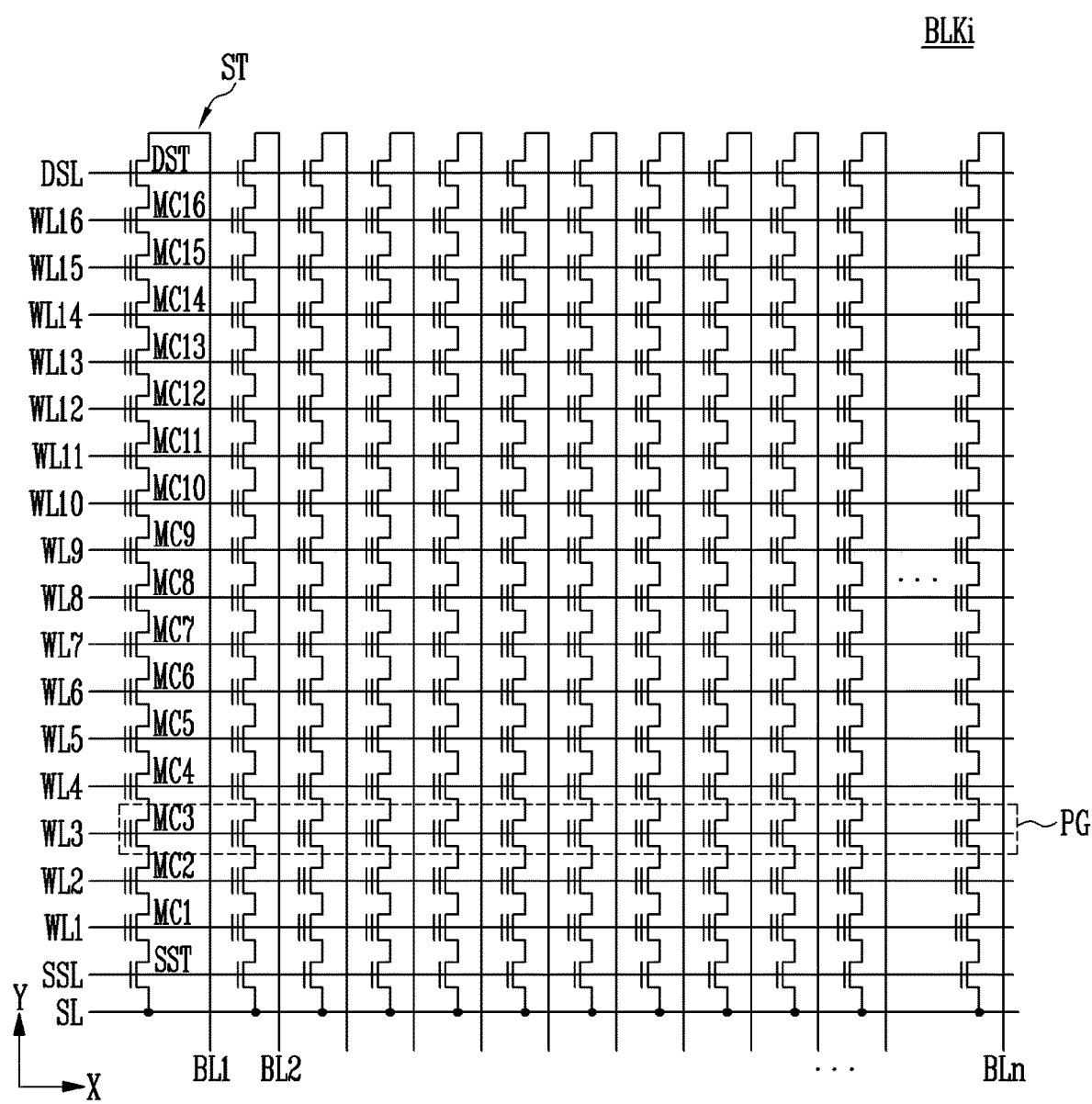
FIG. 4 is a diagram illustrating a memory block according to an embodiment of the present disclosure.

FIG. 4 is a diagram illustrating a representative memory block BLKi according to an embodiment of the present disclosure.

Referring to FIG. 4, the memory block BLKi may be coupled to a plurality of word lines arranged in parallel between a first select line and a second select line. The first select line may be a source select line SSL and the second select line may be a drain select line DSL. Specifically, the memory block BLKi may include a plurality of strings ST coupled between the bit lines BL1 to BLn and a source line SL. The bit lines BL1 to BLn may be coupled to the strings ST, respectively, and the source line SL may be coupled in common to the strings ST. Since the strings ST may have the same configuration, the string ST coupled to the first bit line BL1 is described in detail by way of example.

The string ST may include a source select transistor SST, a plurality of memory cells MC1 to MC16, and a drain select transistor DST coupled in series between the source line SL and the first bit line BL1. Each string ST may include at least one source select transistor SST, at least one drain select transistor DST, and memory cells more than the 16 memory cells MC1 to MC16 shown in FIG. 4.

A source of the source select transistor SST may be coupled to the source line SL and a drain of the drain select transistor DST may be coupled to the first bit line BL1. The memory cells MC1 to MC16 may be coupled in series between the source select transistor SST and the drain select transistor DST. Gates of the source select transistors SST included in different strings ST may be coupled to the source select line SSL, gates of the drain select transistors DST may be coupled to the drain select line DSL, and gates of the memory cells MC1 to MC16 may be coupled to a plurality of word lines WL1 to WL16. A group of memory cells coupled to the same word line, among memory cells included in different strings ST, may be referred to as a physical page PG. Therefore, the memory block BLKi may include as many physical pages PG as the number of word lines WL1 to WL16.

Each of the memory cells may be a single level cell (SLC) storing one data bit, a multi-level cell (MLC) storing two data bits, a triple level cell (TLC) storing three data bits, or a quad level cell (QLC) storing four data bits.

The single level cell (SCL) may include one-bit data. One physical page PG of the SLC may store one logical page (LPG) data. One LPG data may include as many data bits as the number of cells included in one physical page PG.

The multi-level cell (MLC), the triple level cell (TLC), and the quad level cell (QLC) may store two or more bits of data. One physical page PG may store data corresponding to two or more logical pages LPG.

Figure 5:
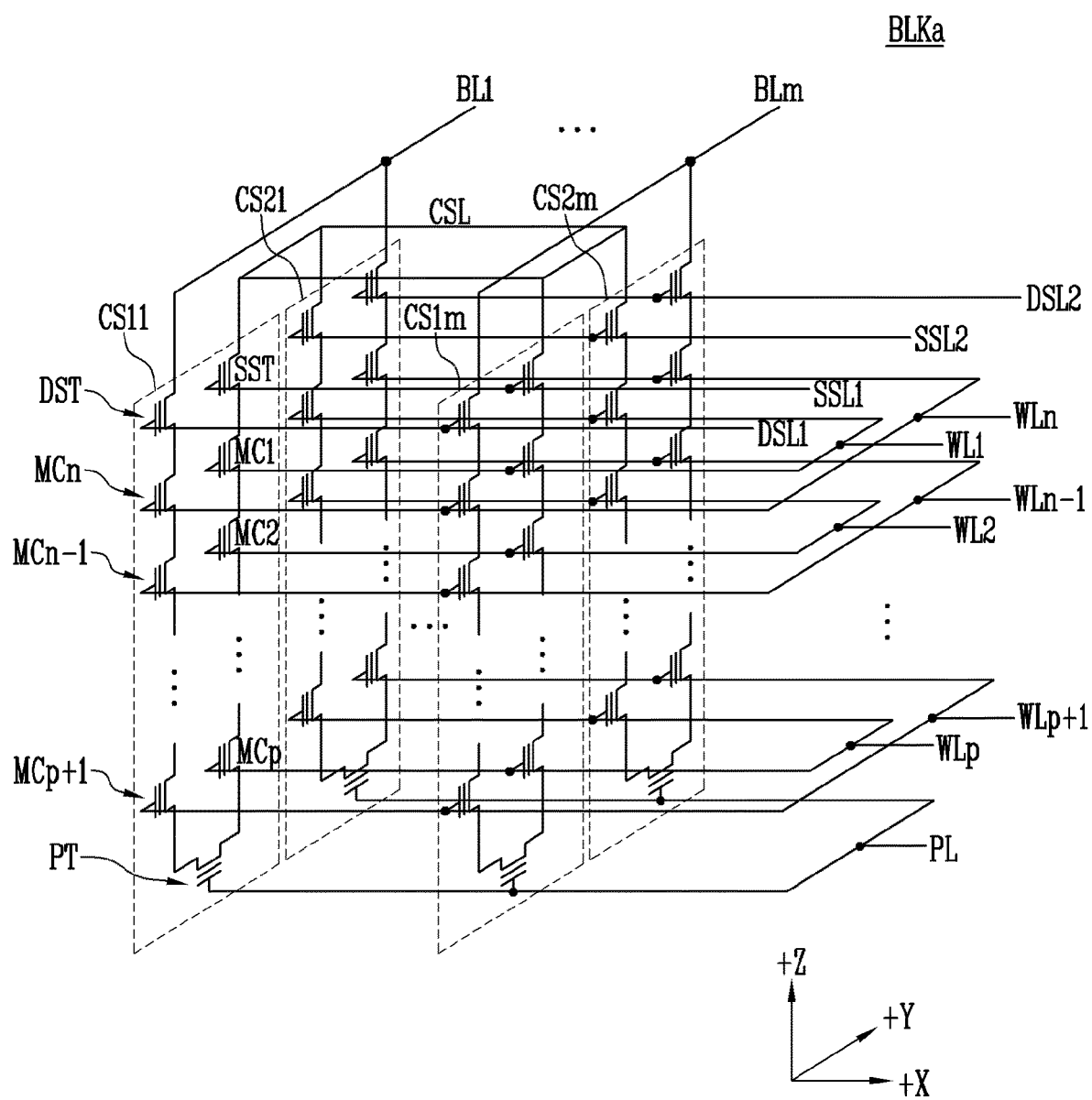
FIG. 5 is a diagram illustrating a memory block according to an embodiment of the present disclosure.

FIG. 5 is a diagram illustrating a memory block BLKa according to an embodiment of the present disclosure.

Referring to FIG. 5, a representative memory (BLKa) among the memory blocks BLK1 to BLKz is shown. The memory block BLKa may include a plurality of cell strings CS11 to CS1m and CS21 to CS2m. According to an embodiment, each of the plurality of cell strings CS11 to CS1m and CS21 to CS2m may be formed in a 'U' shape. In the memory block BLKa, m cell strings may be arranged in a row direction (e.g., X direction).

FIG. 5 illustrates two cell strings arranged in a column direction (e.g., +Y direction) for clarity. However, three or more cell strings may be arranged in the column direction (+Y direction).

Each of the cell strings CS11 to CS1m and CS21 to CS2m may include at least one source select transistor SST, first to n-th memory cells MC1 to MCn, a pipe transistor PT, and at least one drain select transistor DST.

Each of the select transistors SST and DST and each of the memory cells MC1 to MCn may have a similar structure. According to an embodiment, each of the select transistors SST and DST and the memory cells MC1 to MCn may include a channel layer, a tunneling insulating layer, a charge storage layer, and a blocking insulating layer. According to an embodiment, a pillar for providing a channel layer may be provided in each cell string. According to an embodiment, a pillar for providing at least one of the channel layer, the tunneling insulating layer, the charge storage layer, and the blocking insulating layer may be provided to each cell string.

The source select transistor SST of each cell string may be coupled between a common source line CSL and first to pth memory cells MC1 to MCp.

According to an embodiment, source select transistors of strings arranged in the same row may be coupled to one source select line extending in the row direction, and source select transistors of strings arranged in different rows may be coupled to different source select lines. As shown in FIG. 5, the source select transistors of the cell strings CS11 to CS1m in the first row may be coupled to a first source select line SSL1. The source select transistors of the cell strings CS21 to CS2m in the second row may be coupled to a second source select line SSL2.

According to another embodiment, the source select transistors SST of the cell strings CS11 to CS1m and CS21 to CS2m may be coupled in common to one source select line.

The first to n-th memory cells MC1 to MCn of each string may be coupled between the source select transistor SST and the drain select transistor DST.

The first to n-th memory cells MC1 to MCn may be divided into first to pth memory cells MC1 to MCp and (p+1)th to n-th memory cells MCp+1 to MCn. The first to pth memory cells MC1 to MCp may be sequentially arranged in −Z direction and be coupled in series between the source select transistor SST and the pipe transistor PT. The (p+1)th to n-th memory cells MCp+1 to MCn may be sequentially arranged in +Z direction and be coupled in series between the pipe transistor PT and the drain select transistor DST. The first to pth memory cells MC1 to MCp and the (p+1)th to n-th memory cells MCp+1 to MCn may be coupled to each other through the pipe transistor PT. The gates of the first to n-th memory cells MC1 to MCn of each cell string may be coupled to the first to n-th word lines WL1 to WLn, respectively.

A gate of the pipe transistor PT of each cell string may be coupled to a pipe line PL.

The drain select transistor DST of each cell string may be coupled between the corresponding bit line and the memory cells MCp+1 to MCn. Cell strings arranged in the row direction may be coupled to one drain select line extending in the row direction. Drain select transistors of the cell strings CS11 to CS1m in the first row may be coupled to a first drain select line DSL1. Drain select transistors of the cell strings CS21 to CS2m in the second row may be coupled to a second drain select line DSL2.

Cell strings arranged in the column direction may be coupled to bit lines extending in the column direction. As shown in FIG. 5, the cell strings CS11 and CS21 in the first column may be coupled to a first bit line BL1. The cell strings CS1m and CS2m in the mth column may be coupled to an mth bit line BLm.

Memory cells coupled to the same word line, among the strings arranged in the row direction, may form a single page. For example, memory cells coupled to the first word line WL1, among the cell strings CS11 to CS1m in the first row, may constitute one page. Among the cell strings CS21 to CS2m in the second row, memory cells coupled to the first word line WL1 may constitute another page. When one of the drain select lines DSL1 and DSL2 is selected, cell strings arranged in one row direction may be selected. One page may be selected from the selected cell strings by selecting one of the word lines WL1 to WLn.

According to another embodiment, even bit lines and odd bit lines may replace the first to mth bit lines BL1 to BLm. In addition, even cell strings of the cell strings CS11 to CS1m or CS21 to CS2m arranged in the row direction may be coupled to even bit lines, respectively, and odd cell strings of the cell strings CS11 to CS1m or CS21 to CS2m arranged in the row direction may be coupled to odd bit lines, respectively.

According to an embodiment, at least one of the first to n-th memory cells MC1 to MCn may serve as a dummy memory cell. For example, one or more dummy memory cells may be provided to reduce an electric field between the source select transistor SST and the memory cells MC1 to MCp. Alternatively, one or more dummy memory cells may be provided to reduce an electric field between the drain select transistor DST and the memory cells MCp+1 to MCn. When more dummy memory cells are provided, the operational reliability of the memory block BLKa may be improved, whereas the size of the memory block BLKa may be increased. On the other hand, when the number of dummy memory cells decreases, the size of the memory block BLKa may be reduced, and the operational reliability of the memory block BLKa may be reduced.

In order to efficiently control one or more dummy memory cells, each of the dummy memory cells may have a required threshold voltage. Before or after an erase operation on the memory block BLKa, program operations may be performed on some or all of the dummy memory cells. When an erase operation is performed after a program operation is performed, dummy memory cells may have required threshold voltages by controlling voltages applied to dummy word lines coupled to the respective dummy memory cells.

Figure 6:
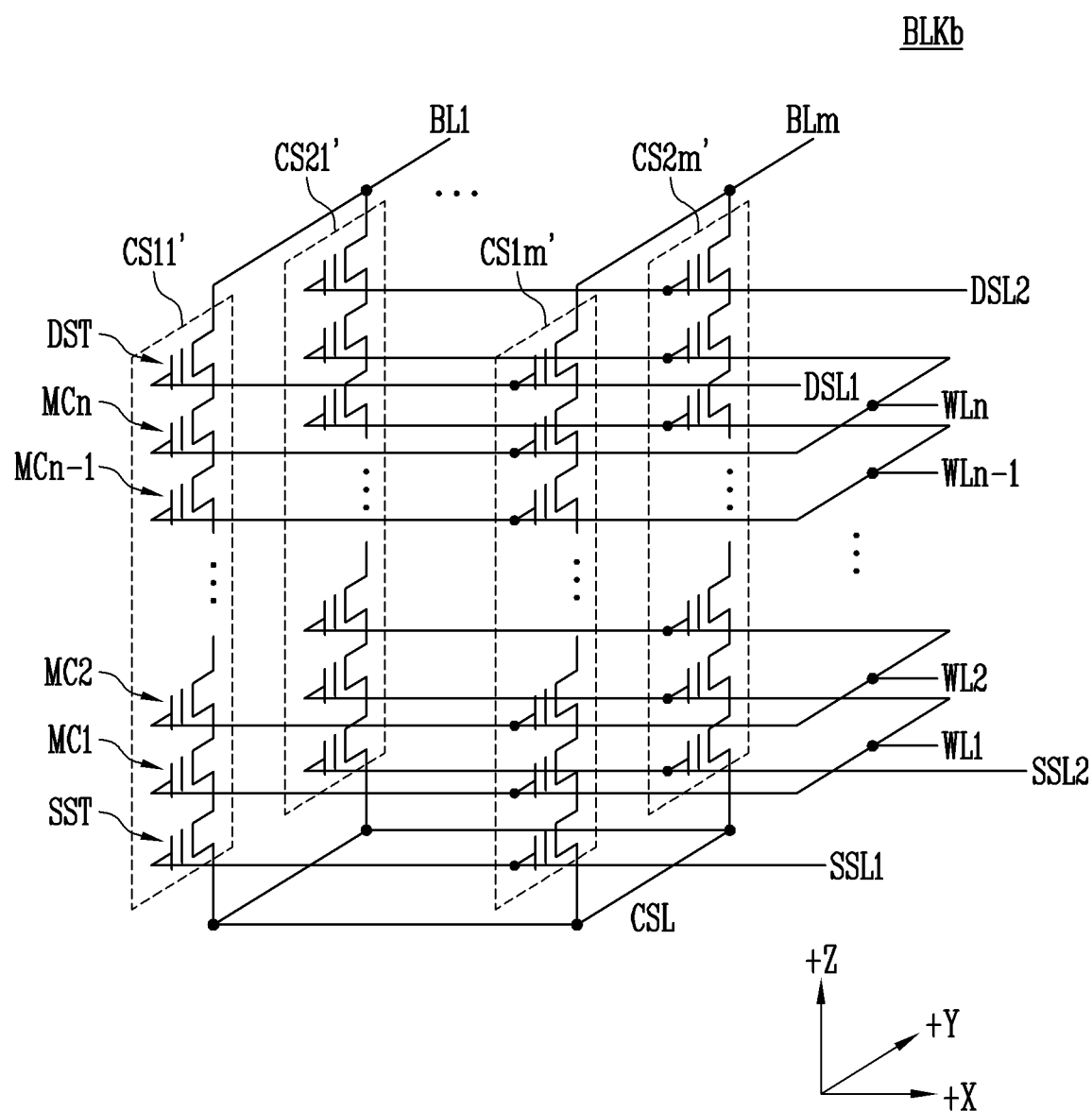
FIG. 6 is a diagram illustrating a memory block according to an embodiment of the present disclosure.

FIG. 6 is a block diagram illustrating a memory block BLKb according to an embodiment of the present disclosure.

Referring to FIG. 6, a representative memory block (BLKb) among the memory blocks BLK1 to BLKz is shown. The memory block BLKb may include a plurality of cell strings CS11' to CS1m' and CS21' to CS2m'. Each of the plurality of cell strings CS11' to CS1m' and CS21' to CS2m' may extend in the +Z direction. Each of the plurality of cell strings CS11' to CS1m' and CS21' to CS2m' may include at least one source select transistor SST, the first to n-th memory cells MC1 to MCn, and at least one drain select transistor DST which are stacked on a substrate (not shown).

The source select transistor SST of each cell string may be coupled between the common source line CSL and first to n-th memory cells MC1 to MCn. Source select transistors of cell strings arranged in the same row may be coupled to the same source select line. Source select transistors of the cell strings CS11' to CS1m' in the first row may be coupled to the first source select line SSL1. Source select transistors of the cell strings CS21' to CS2m' in the second row may be coupled to the second source select line SSL2. According to another embodiment, the source select transistors of the cell strings CS11' to CS1m' and CS21' to CS2m' may be commonly coupled to a single source select line.

The first to n-th memory cells MC1 to MCn of each cell string may be coupled between the source select transistor SST and the drain select transistor DST. The gates of the first to n-th memory cells MC1 to MCn may be coupled to the first to n-th word lines WL1 to WLn, respectively.

The drain select transistor DST of each cell string may be coupled between the corresponding bit line and the memory cells MC1 to MCn. Drain select transistors of cell strings arranged in the row direction may be coupled to a drain select line extending in the row direction. Drain select transistors of the cell strings CS11' to CS1m' in the first row may be coupled to the first drain select line DSL1. Drain select transistors of the cell strings CS21' to CS2m' in the second row may be coupled to the second drain select line DSL2.

As a result, the memory block BLKb shown in FIG. 6 may have a circuit that is equivalent or similar to that of the memory block BLKa shown in FIG. 5, except that the pipe transistor PT is removed from each cell string of the memory block BLKb.

According to another embodiment, even bit lines and odd bit lines may replace the first to mth bit lines BL1 to BLm. In addition, even cell strings of the cell strings CS11' to CS1m' or CS21' to CS2m' arranged in the row direction may be coupled to even bit lines, respectively, and odd cell strings of the cell strings CS11' to CS1m' or CS21' to CS2m' arranged in the row direction may be coupled to odd bit lines, respectively.

According to an embodiment, at least one of the first to n-th memory cells MC1 to MCn may serve as a dummy memory cell. For example, one or more dummy memory cells may be provided to reduce an electric field between the source select transistor SST and the memory cells MC1 to MCn. Alternatively, one or more dummy memory cells may be provided to reduce an electric field between the drain select transistor DST and the memory cells MC1 to MCn. When more dummy memory cells are provided, the operational reliability of the memory block BLKb may be improved, whereas the size of the memory block BLKb may be increased. When fewer memory cells are provided, the size of the memory block BLKb may be reduced and the operational reliability of the memory block BLKb may be degraded.

In order to efficiently control one or more dummy memory cells, each of the dummy memory cells may have a required threshold voltage. Before or after an erase operation on the memory block BLKb, program operations may be performed on some or all of the dummy memory cells. When an erase operation is performed after a program operation is performed, dummy memory cells may have required threshold voltages by controlling voltages applied to dummy word lines coupled to the respective dummy memory cells.

Figure 7:
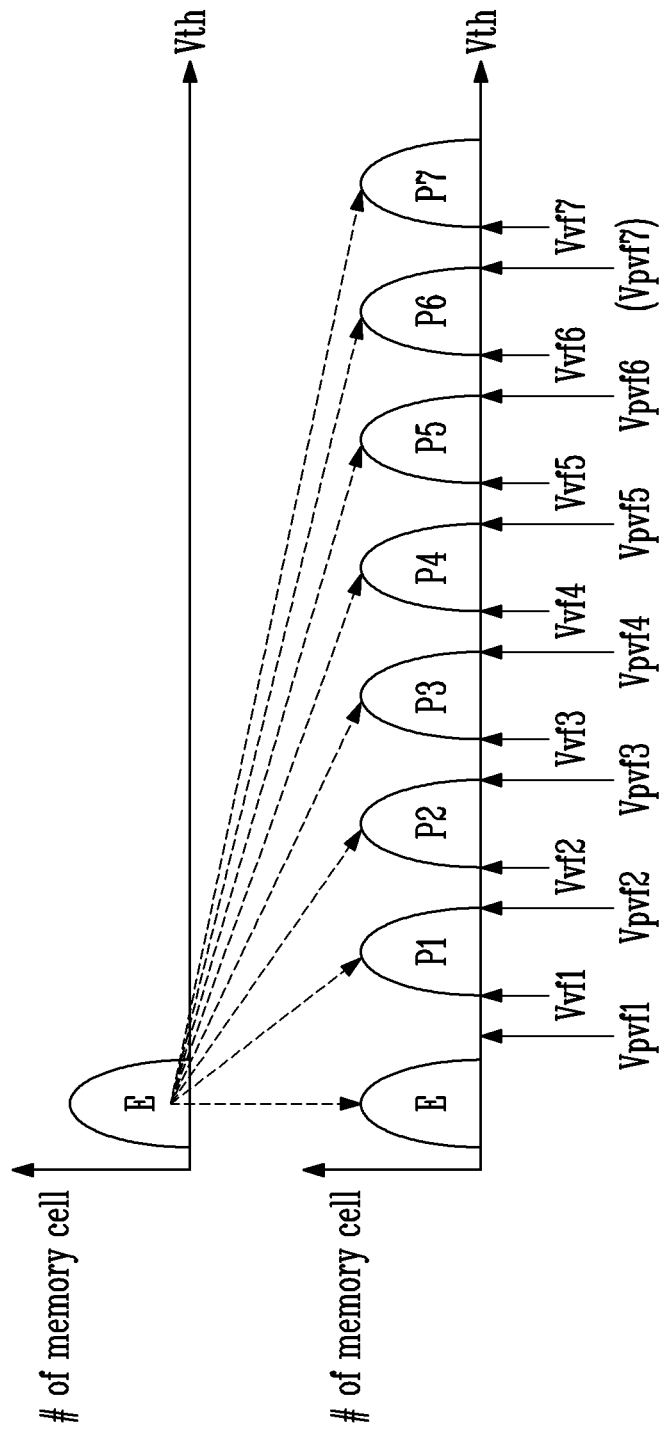
FIG. 7 is a block diagram illustrating program states of memory cells according to an embodiment of the present disclosure.

FIG. 7 is a block diagram illustrating program states of memory cells according to an embodiment of the present disclosure.

Referring to FIG. 7, memory cells, configured as triple level cells (TLCs), may be programmed into any of an erase state E or seven program states P1 to P7 according to threshold voltages thereof. Operations pertaining to a triple level cell (TLC) is illustrated and described by way of example. However, the memory cells of FIG. 7 may be embodied as multi-level cells (MLCs), single level cells (SLCs), quad level cells (QLCs), or the like. In addition, different terminology may be used to denote the erase state; alternatively, it may be expressed as a zeroth program state P0. In that case, the erase state E and the program states P1 to P7 as shown in FIG. 7 may also be expressed as zeroth to seventh program states P0 to P7.

Memory cells coupled to a selected word line may have threshold voltages corresponding to one of the erase state E and the seven program states P1 to P7. In other words, the memory cells may be programmed to have threshold voltages corresponding to one of the erase state E and the seven program states P1 to P7. The memory cells before a program operation is performed may have the erase state E. During the program operation, the memory cells having the erase state E may be programmed into one of the seven program states as a program voltage is applied to the selected word line.

In addition, the erase state E and the seven program states P1 to P7 may be separated from each other by using a verify voltage. The verify voltage may include a main verify voltage and a pre-verify voltage. The pre-verify voltage may have a lower potential level than the main verify voltage and is applied to the selected word line before the main verify voltage is applied thereto.

In addition, adjacent program states of memory cells may be separated (or distinguished) from each other by the main verify voltage and the pre-verify voltage. For example, the erase state E and the first program state P1 may be separated from each other by a first pre-verify voltage Vpvf1 and a first main verify voltage Vvf1. The first program state P1 and the second program state P2 may be separated from each other by a second pre-verify voltage Vpvf2 and a second main verify voltage Vvf2. The second program state P2 and the third program state P3 may be separated from each other by a third pre-verify voltage Vpvf3 and a third main verify voltage Vvf3. The third program state P3 and the fourth program state P4 may be separated from each other by a fourth pre-verify voltage Vpvf4 and a fourth main verify voltage Vvf4. The fourth program state P4 and the fifth program state P5 may be separated from each other by a fifth pre-verify voltage Vpvf5 and a fifth main verify voltage Vvf5. The fifth program state P5 and the sixth program state P6 may be separated from each other by a sixth pre-verify voltage Vpvf6 and a sixth main verify voltage Vvf6. The sixth program state P6 and the seventh program state P7 may be separated from each other by a seventh pre-verify voltage Vpvf7 and a seventh main verify voltage Vvf7. However, in an embodiment, to reduce program time, the seventh pre-verify voltage Vpvf7 may not be applied. In this case, the sixth program state P6 and the seventh program state P7 may be separated from each other by the seventh main verify voltage Vvf7.

The pre-verify voltage and the main verify voltage may be used to determine a potential level pre-charged to the bit line, or a level of the program voltage applied to the selected word line. For example, a threshold voltage of a memory cell may be one of three states, i.e., a first state, a second state and a third state, as determined by the first pre-verify voltage and the first main verify voltage. In other words, the threshold voltage of the memory cell may be in the first state less than the first pre-verify voltage, the second state greater than the first pre-verify voltage and less than the first main verify voltage, or the third state greater than the first main verify voltage.

A memory cell having a threshold voltage corresponding to the first state may be programmed using a program voltage having a higher voltage level than that of a memory cell having a threshold voltage corresponding to the second state or the third state. Alternatively, a bit line coupled to the memory cell having the threshold voltage corresponding to the first state may be pre-charged to a voltage having a lower voltage level than a bit line coupled to the memory cell having the threshold voltage corresponding to the second state or the third state.

The memory cell having the threshold voltage corresponding to the second state may be programmed using a program voltage having a voltage level that is lower than that of the memory cell having the threshold voltage corresponding to the first state and is higher than that of the memory cell having the threshold voltage corresponding to the third state. Alternatively, the bit line coupled to the memory cell having the threshold voltage corresponding to the second state may be pre-charged to a voltage having a voltage level that is higher than the pre-charge voltage of the bit line coupled to the memory cell having the threshold voltage corresponding to the first state and is lower than the pre-charge voltage of the bit line coupled to the memory cell having the threshold voltage corresponding to the third state.

According to the program method as shown in FIG. 7, the seven program states P1 to P7 may be formed from one erase state E. The program states as shown in FIG. 7 may be formed when a program operation including first to Mth program loops as shown below in FIG. 8 is performed once.

Figure 8:
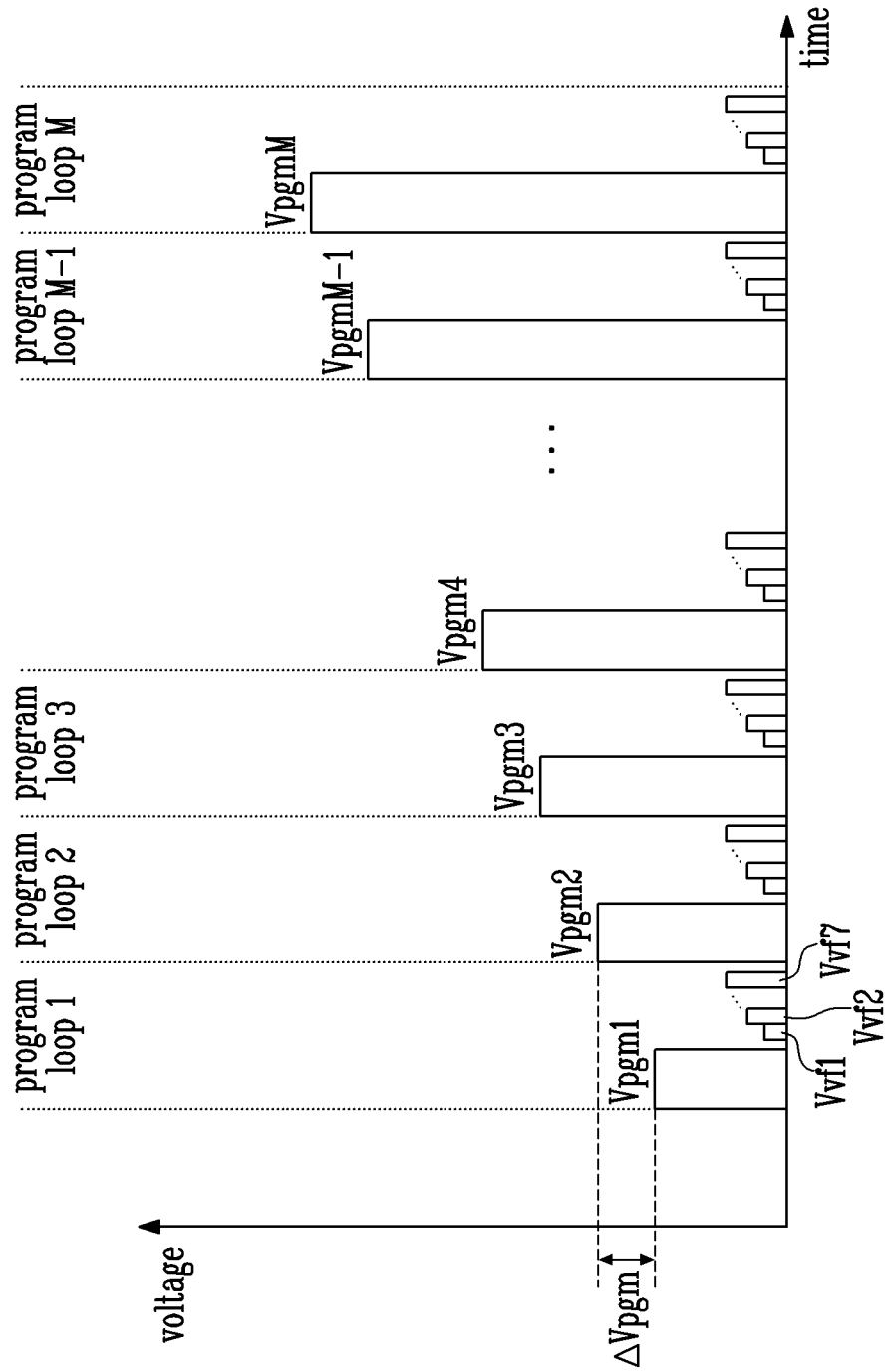
FIG. 8 is a diagram illustrating a voltage applied to a selected word line during a program operation according to another embodiment.

FIG. 8 is a diagram illustrating a voltage applied to a selected word line during a program operation according to an embodiment.

Referring to FIG. 8, a program operation for forming the program states shown in FIG. 7 may include M program loops. Each of the program loops may include an operation of applying a program voltage to a selected word line and an operation of applying a verify voltage to the selected word line. The operation of applying the program voltage may be performed in a program period and the operation of applying the verify voltage may be performed in a verify period. The program voltage may be applied to increase a threshold voltage of a memory cell. The verify voltage may be applied to check whether the corresponding memory cell has reached a target program state by determining the threshold voltage of the memory cell. For example, a first program loop may include an operation of applying a first program voltage Vpgm1 and the plurality of main verify voltages Vvf1 to Vvf7 to the selected word line. For convenience of explanation, it is illustrated that seven main verify voltages are applied in each program loop. However, the number of verify voltages is not limited; a different number of verify voltages may be applied in a given program loop, including main verify voltage(s) and pre-verify voltage(s).

In each successive program loop, the program voltage may be increased by a step voltage $\Delta Vpgm$, which is referred to as an Incremental Step Pulse Program (ISPP) scheme. For example, a second program voltage Vpgm2 applied to the selected word line in a second program loop may be greater than the first program voltage Vpgm1 by the step voltage $\Delta Vpgm$. By way of example, the step voltage $\Delta Vpgm$ is illustrated as having a fixed value. However, the step voltage $\Delta Vpgm$ may be dynamically varied.

A memory cell having reached a target program state during one of the M program loops may be program-inhibited so that program may be no longer performed thereon. Thus, even when the next program loop is performed, a threshold voltage of the program-inhibited cell may be maintained. For example, a memory cell having been completely programmed to the second program state P2 corresponding to the target program state in the second program loop may be program-inhibited in the third and subsequent program loops. According to an embodiment, the bit line of the memory cell having reached the target program state may be pre-charged to a program inhibition voltage. When the bit line is pre-charged to the program inhibition voltage, a channel of the memory cell may be self-boosted by the program voltage and the memory cell may not be programmed.

Figure 9:
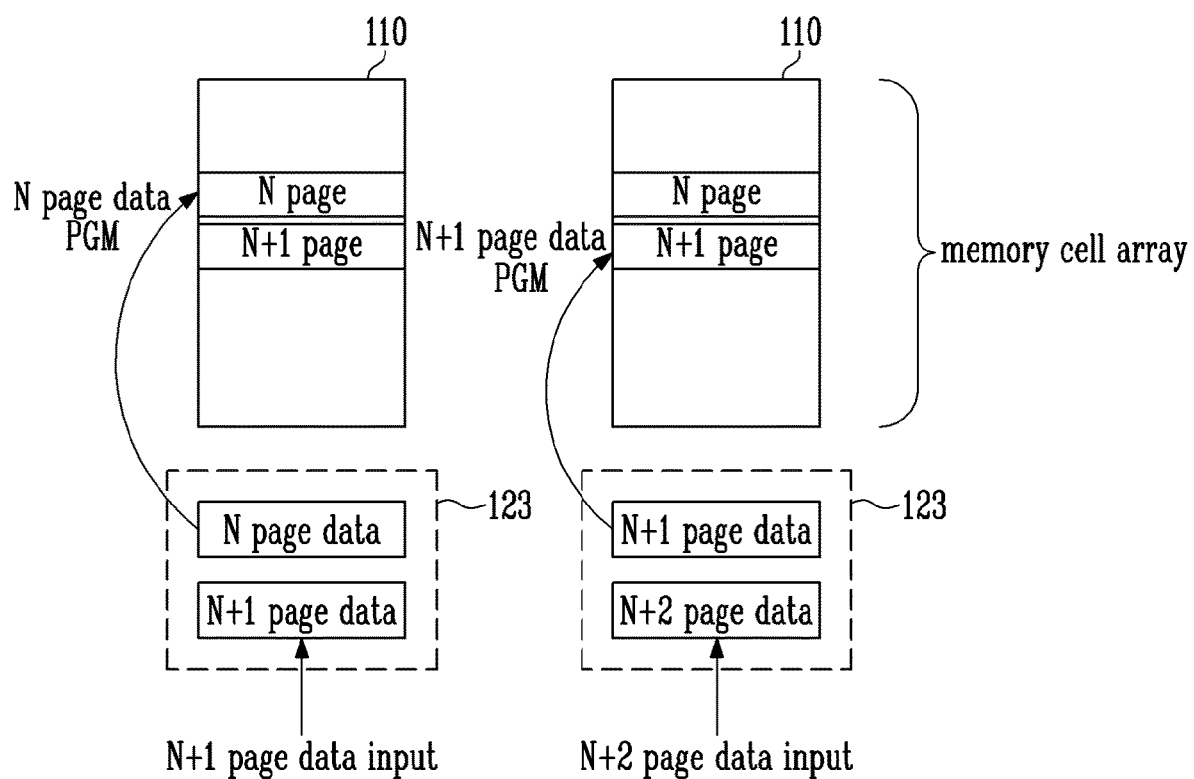
FIG. 9 is a diagram illustrating a cache program operation according to an embodiment of the present disclosure.

FIG. 9 is a diagram illustrating a cache program operation according to an embodiment of the present disclosure.

Referring to FIG. 9, a plurality of pages in the memory cell array 110 may be sequentially programmed. For example, an N-th page may be programmed before an (N+1)th page. The plurality of pages may be programmed according to data temporarily stored in the page buffer group 123. For example, N-th page data temporarily stored in the page buffer group 123 may be programmed into the N-th page in the memory cell array 110.

During a cache program operation, while the N-th page data is programmed into the N-th page, (N+1)th page data may be input to the page buffer group 123. When the N-th page data is programmed into the N-th page, the (N+1)th page data temporarily stored in the page buffer group 123 may be programmed into the (N+1)th page. During the cache program operation, while the (N+1)th page data is programmed into the (N+1)th page, (N+2)th page data may be input to the page buffer group 123.

In other words, when data is programmed into the memory cell array 110, data to be programmed to the next page may be input to the page buffer group 123, thereby reducing the total time it takes to program all pages.

Figure 10:
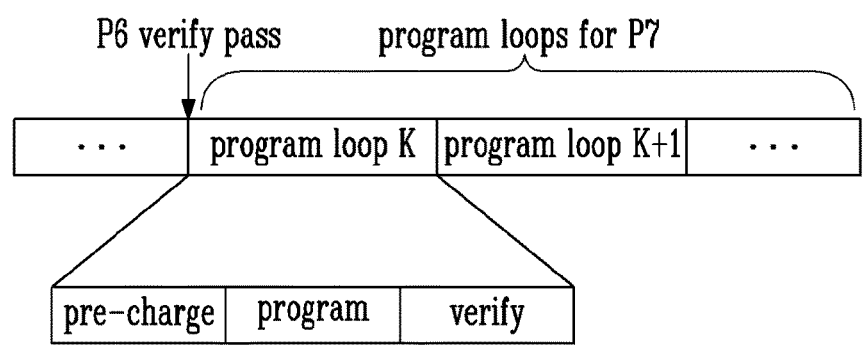
FIG. 10 is a diagram illustrating a program loop according to an embodiment of the present disclosure.

FIG. 10 is a diagram illustrating a program loop according to an embodiment of the present disclosure.

Referring to FIG. 10, a program loop may include a pre-charge period, a program period and a verify period.

The pre-charge period may refer to a period in which a pre-charge voltage is applied to a bit line. The pre-charge voltage may be a program permission voltage or a program inhibition voltage. The program permission voltage may be 0 V, and the program inhibition voltage may be a power supply voltage Vcc. The pre-charge voltage may be a double program voltage having a voltage level that is greater than the program permission voltage and lower than the program inhibition voltage.

The program period may refer to a period where an operating voltage is applied to a word line so that a threshold voltage of a selected memory cell may be included in a target program state. The program period may be used to make a program state of the selected memory cell the target program state. In the program period, a program voltage Vpgm may be applied to a selected word line and a pass voltage Vpass may be applied to an unselected word line.

The verify period may refer to a period where it is determined, after the program period, whether the program state of the selected memory cell has reached the target program state. The verify period may include a bit line sensing period. In the verify period, the sensing circuit 126 may generate a reference current in response to the allowable bit signal VRYBIT and may compare the sensing voltage VPB received from the page buffer group 123 with a reference voltage generated by the reference current to output a pass signal PASS or a fail signal FAIL. The sensing circuit 126 may output the pass signal PASS or the fail signal FAIL by comparing the reference current with a sensing current received from the page buffer group 123. As described above, the sensing voltage VPB may be compared with the reference voltage. However, a sensing current IPB and the reference current may be compared to output the pass signal PASS or the fail signal FAIL. After a verify operation for the sixth program state P6 passes, the sensed data from the bit line may be stored during the verify period.

As shown in FIG. 10, after verify for the sixth program state P6 passes before a Kth program loop, the Kth program loop and subsequent program loops may be performed to form the seventh program state P7. Memory cells where the sixth program state P6 is the target program state may be program-inhibited from the Kth program loop, so that the memory cells may be no longer programmed from the Kth program loop. For example, during a pre-charge period of the Kth program loop, the power supply voltage Vcc may be applied to the bit line of the memory cell having reached the sixth program state P6 corresponding to the target program state, so that the memory cell having reached the sixth program state P6 corresponding to the target program state may be program-inhibited.

Memory cells where the seventh program state P7 is the target program state may be program-allowed, and the memory cells may be programmed from the Kth program loop. For example, during the pre-charge period of the Kth program loop, a ground voltage GND or a voltage of 0 V may be applied to the bit line of the memory cell having the seventh program state P7 aso the target program state, so that the memory cell having the seventh program state P7 as the target program state may be programmed.

Figure 11:
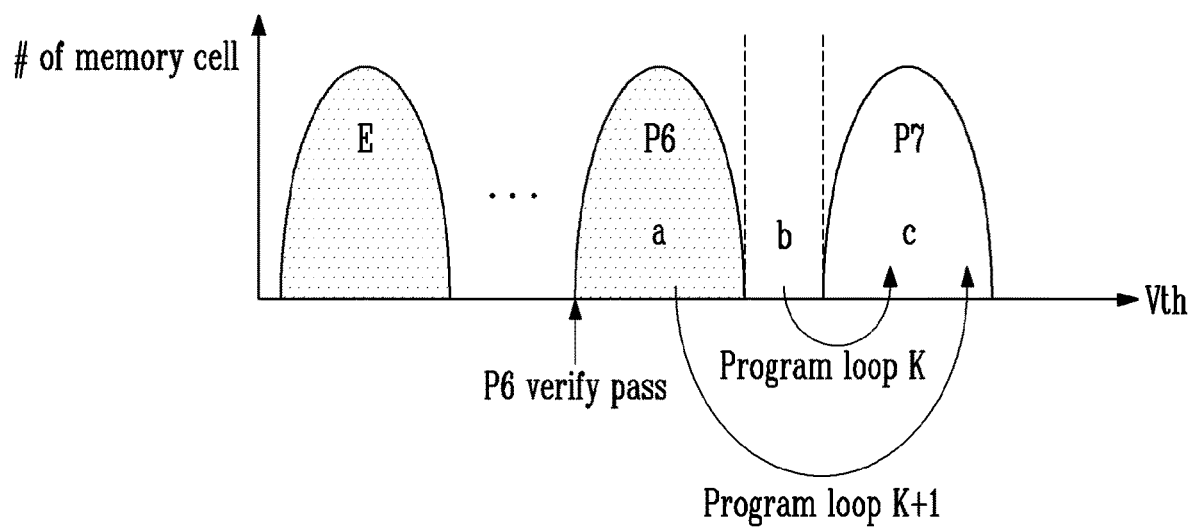
FIG. 11 is a diagram illustrating a process in which memory cells are programmed according to an embodiment of the present disclosure.

FIG. 11 is a diagram illustrating a process in which a memory cell is programmed according to an embodiment of the present disclosure.

Referring to FIG. 11, when a verify operation for the sixth program state P6 passes, memory cells in which the erase state E to the sixth program state P6 are the target program states may be controlled so as not to be programmed in the next program loop. For example, the bit line of memory cells having the erase state E to the sixth program state P6 as the target program states may be pre-charged to the program inhibition voltage in the pre-charge period, so that these memory cells may not be programmed in the Kth program loop.

Programming the memory cells in which the seventh program state P7 is the target program state may be performed from the Kth program loop. For example, the bit line of the memory cells having the seventh program state P7 as the target program state may be pre-charged to the program permission voltage in the pre-charge period.

As shown in FIG. 11, memory cells in which the seventh program state P7 is the target program state may exist in a first region (a), a second region (b), and a third region (c). The memory cell in the first region (a) may have a lower threshold voltage than the memory cells in the second region (b) and the third region (c). Therefore, the memory cell in the first region (a) may reach the seventh program state P7 after the Kth program loop and a (K+1)th program loop are performed. The memory cell included in the first region (a) which has reached the seventh program state P7 may be programmed-inhibited. The memory cell in the second region (b) may reach the seventh program state P7 after the program period of the Kth program loop, and may then be program-inhibited. When the memory cell is program-inhibited, the program inhibition voltage may be applied to the corresponding bit line in the next program loop. The program inhibition voltage may be the power supply voltage Vcc. Since the memory cell in the third region (c) has already been programmed, the memory cell may be program-inhibited before the Kth program loop. The program operation controller 131 may program the memory cell in the first region (a) using a program voltage having a higher voltage level than that applied when programming the memory cell in the second region (b). Alternatively, the program operation controller 131 may program the memory cell in the first region (a) using a bit line pre-charge voltage having a lower voltage level than that applied when programming the memory cell in the second region (b).

Figure 12:
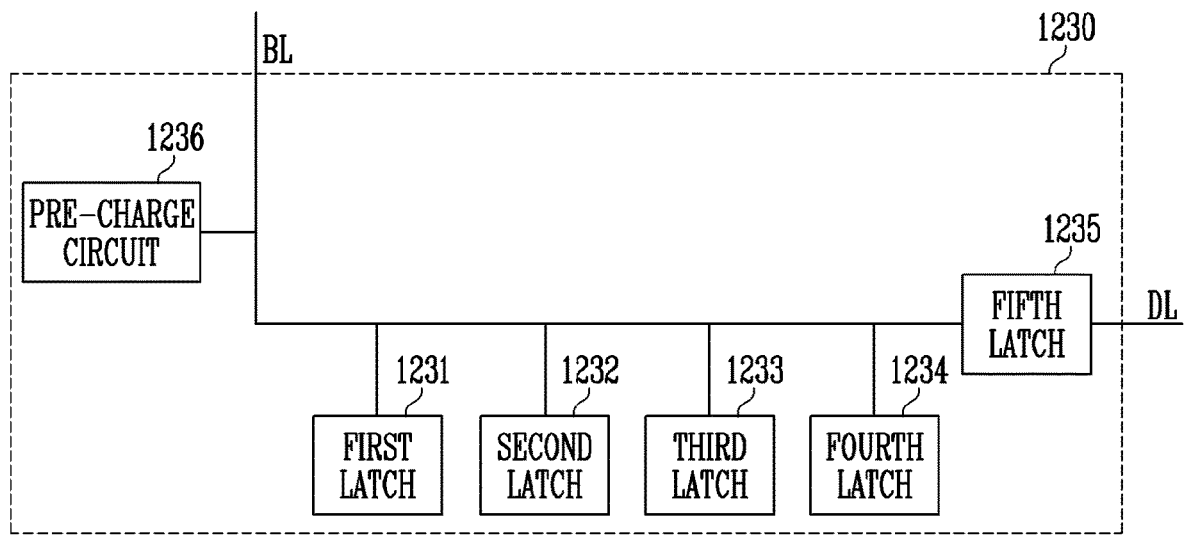
FIG. 12 is a diagram illustrating a page buffer according to an embodiment of the present disclosure.

FIG. 12 is a diagram illustrating a page buffer 1230 according to an embodiment of the present disclosure.

Referring to FIG. 12, the page buffer 1230 may include a first latch 1231, a second latch 1232, a third latch 1233, a fourth latch 1234, a fifth latch 1235, and a pre-charge circuit 1236. The page buffer 1230 may be one page buffer PBi among the first to n-th page buffers PB1 to PBn in the page buffer group 123 as shown in FIG. 2.

The page buffer 1230 may be coupled to the memory cell array 110 through a bit line BL. The page buffer 1230 may operate in response to the control of the program operation controller 131 during a program operation. More specifically, the page buffer 1230 may operate in response to the page buffer control signals PBSIGNALS. The page buffer 1230 may exchange data with the column decoder 124 through the data lines DL.

The first latch 1231 may store pre-charge data used to determine a voltage to pre-charge the bit line BL, or sensed data sensed from the bit line BL. The first latch 1231 may be referred as a sensing latch 1231.

The second latch 1232 may store pre-verify information on a pre-verify voltage until a verify operation for a particular program state passes. The second latch may be referred as a pre-latch 1232. In addition, the second latch 1232 may store main verify information on a main verify voltage after the verify operation for the particular program state passes. For example, the second latch 1232 may store the pre-verify information on the pre-verify voltage until a verify operation for the sixth program state P6 passes, and may store the main verify information on the main verify voltage after the verify operation for the sixth program state P6 passes.

The third to fifth latches 1233 to 1235 may temporarily store data to be programmed to the memory cell coupled to the bit line BL. The third to fifth latches 1233 to 1235 may be referred to as data latches 1233 to 1235. In addition, the third to fifth latches 1233 to 1235 may distribute and store the main verify information on the main verify voltage until the verify operation for the particular program state passes. For example, until the verify operation for the sixth program state P6 passes, the third latch 1233 may temporarily store an LSB bit and main verify information, the fourth latch 1234 may store a CSB bit and main verify information, and the fifth latch 1235 may store an MSB bit and main verify information.

Since the fifth latch 1235 is coupled to a data line DL, the fifth latch 1235 may receive data from an external source.

The data sensed from the bit line BL may be transferred from the first latch 1231 to the sensing circuit 126. The sensed data may be the sensing voltage VPB or the sensing current IPB. The sensing circuit 126 may generate a reference current in response to the allowable bit signal VRYBIT signal and may compare the sensing voltage VPB received from the page buffer 1230 with a reference voltage generated by the reference current to output the verify information. The verify information may include the main verify information on the main verify voltage and the pre-verify information on the pre-verify voltage. In addition, by comparing the threshold voltage of the memory cell with the main verify voltage or the pre-verify voltage, the verify information may be represented as the pass signal PASS or the fail signal FAIL.

In addition, the program operation controller 131 may determine whether to pre-charge the bit line on the basis of the verify information. When the verify operation for the sixth program state P6 passes, the program operation controller 131 may determine whether to pre-charge the bit line on the basis of the verify information latched in the second latch 1232.

The pre-charge circuit 1236 may pre-charge the bit line to one of the program permission voltage and the program inhibition voltage in response to control of the program operation controller 131. Alternatively, the pre-charge circuit 1236 may be pre-charged to a double program voltage.

According to the present disclosure, the program operation controller 131 may form the erase state E or the seven program states P1 to P7 by a single program operation including the first to Mth program loops as shown in FIG. 8. During the program operation, the page buffer 1230 may store an LSB bit, a CSB bit and an MSB bit. For example, the third latch 1233 may store the LSB bit, the fourth latch 1234 may store the CSB bit, and the fifth latch 1235 may store the MSB bit. However, which bits are stored in which of the third to fifth latches 1233 to 1235 is not limited to above-described storage arrangement.

However, when a verify operation for a particular program state passes, a memory cell may be programmed to the next program state even when at least one of the LSB bit, the CSB bit and the MSB bit is not stored in the page buffer 1230. For example, when a verify operation for the fourth program state P4 passes, the memory cell may be programmed to the fifth program state P5 to the seventh program state P7 even when the MSB bit is not stored in the page buffer 1230. Alternatively, when a verify operation for the fifth program state P5 passes, the memory cell may be programmed to the sixth program state P6 and the seventh program state P7 even when the CSB bit is not stored in the page buffer 1230. In other words, when at least one of the bits stored in the third to fifth latches 1233 to 1235 is unnecessary to form a program state, a bit to be stored in the next page may be input to the latch which stores the unnecessary bit. Data stored in the first to fifth latches 1231 to 1235 is described below in detail with reference to FIG. 14.

Figure 13:
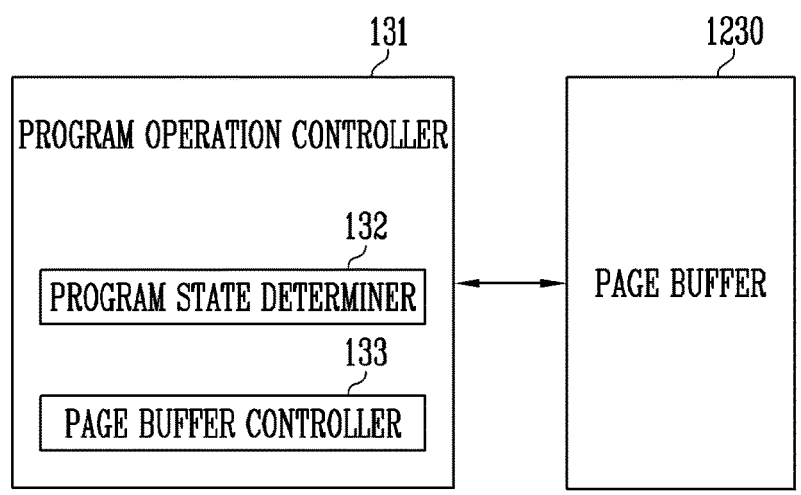
FIG. 13 is a diagram illustrating a program operation controller according to an embodiment of the present disclosure.

FIG. 13 is a diagram illustrating a program operation controller according to an embodiment of the present disclosure.

Referring to FIG. 13, the program operation controller 131 may include a program state determiner 132 and a page buffer controller 133.

The program operation controller 131 may control the peripheral circuit 120 including the page buffer 1230 so that data temporarily stored in the page buffer 1230 may be stored in the memory cell coupled to the bit line. The program operation controller 131 may form the erase state E or the seven program states P1 to P7 by a single program operation including the first to Mth program loops as shown in FIG. 8.

The program state determiner 132 may determine a program state of a memory cell. The program state determiner 132 may use the number of program loops, voltage levels of a pre-verify voltage and a main verify voltage, pre-verify information and main verify information so as to determine a program state of a memory cell. For example, when the verify information stored in the page buffer 1230 indicates pass and the verify voltage corresponds to the fifth pre-verify voltage Vpvf5 and the fifth main verify voltage Vvf5, the program state determiner 132 may determine that the program state of the memory cell is the fifth program state P5. However, the program state determiner 132 may directly receive verify information on a verify operation, i.e., pass or fail information. In addition, the program state determiner 132 may determine whether a threshold voltage of a memory cell has reached a threshold program state. For example, the program state determiner 132 may determine whether the threshold voltage of the memory cell has reached the sixth program state P6.

The page buffer controller 133 may control the page buffer 1230 by outputting the page buffer control signals PBSIGNALS. The page buffer controller 133 may control such that data may be moved between the plurality of latches in the page buffer 1230. For example, the page buffer controller 133 may move data between the latches so that an LSB bit, a CSB bit or an MSB bit to be programmed to a next page may be input to the page buffer 1230. The page buffer controller 133 may control the pre-charge circuit 1236 and the plurality of latches 1231 to 1235 such that the data stored in the page buffer 1230 may be stored in the memory cell. The page buffer controller 133 may control the page buffer 1230 in a pre-charge period, a program period and a verify period.

In addition, when the verify operation for the threshold program state passes, the page buffer controller 133 may move data stored in a latch receiving data from an external source, among the plurality of latches, to another latch. For example, when the verify operation for the sixth program state P6 passes, the page buffer controller 133 may move data from a cache latch (e.g., the fifth latch 1235) receiving the data from the memory controller 200 to another latch (e.g., the second latch 1232 to the fourth latch 1234). The threshold program state may be lower than the highest program state by one level. For example, when the highest program state is the seventh program state P7, the threshold program state may be the sixth program state P6.

In addition, when the verify operation for the threshold program state passes, the page buffer controller 133 may store main verify information, stored in one of the data latches storing the data to be stored in the memory cell, to the latch used to store pre-verify information. For example, when the verify operation for the sixth program state P6 passes, the page buffer controller 133 may store the main verify information stored in the third to fifth latches 1233 to 1235 in the second latch 1232.

In addition, when the verify operation for the threshold program state passes, the page buffer controller 133 may store data to be stored in a subsequently selected memory cell. For example, the page buffer controller 133 may store data to be stored in one of the memory cells of the N-th page in the third to fifth latches 1233 to 1235. When the verify operation for the sixth program state P6 passes, the page buffer controller 133 may store data to be stored in a subsequent memory cell of the (N+1)th page in the third to fifth latches 1233 to 1235. In addition, when the verify operation for the seventh program state P7 passes, the program operation controller 131 may program the subsequent memory cell with the data to be stored in the (N+1)th page.

Figure 14:
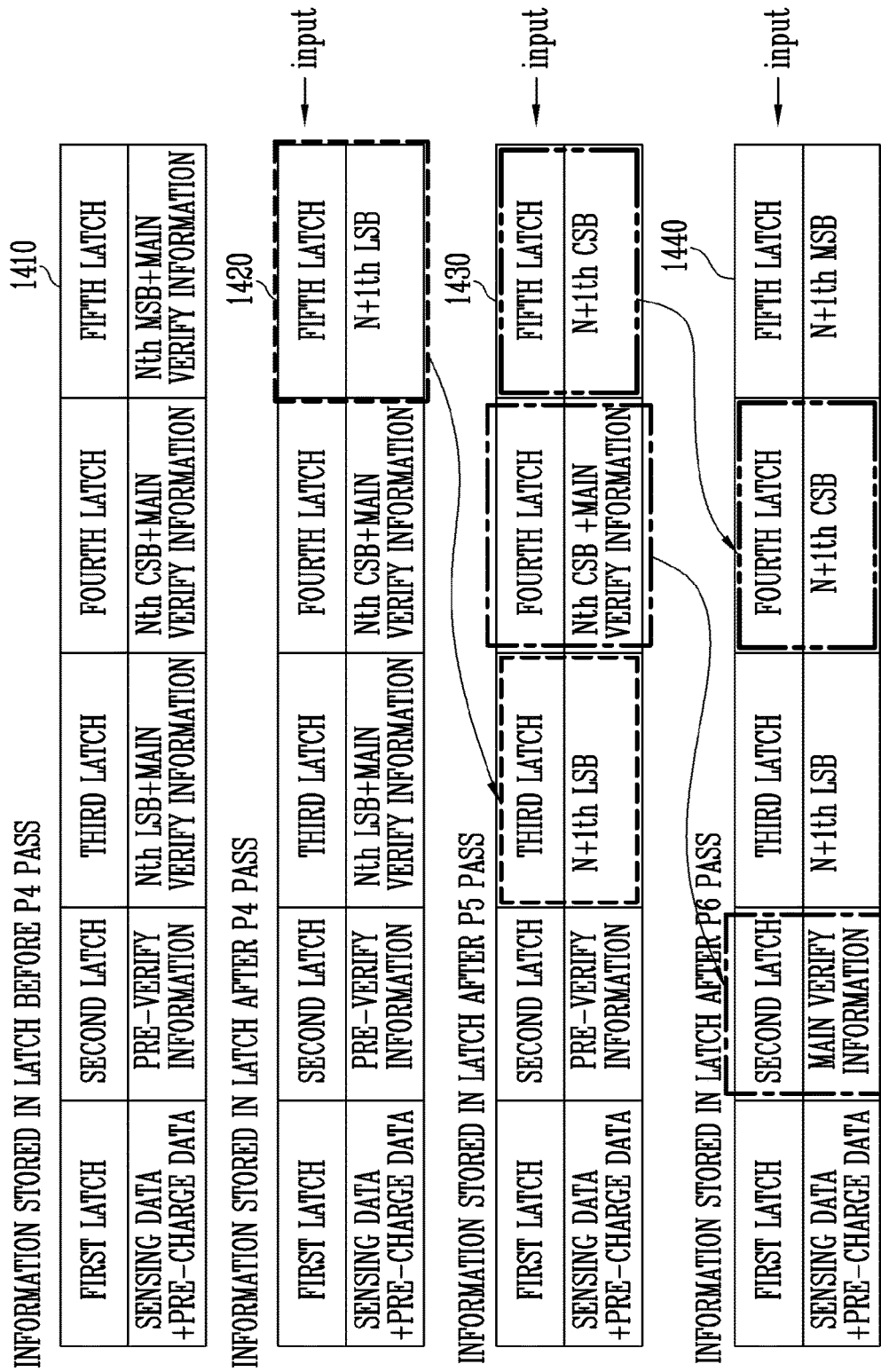
FIG. 14 is a diagram illustrating information stored in each latch according to an embodiment of the present disclosure.

FIG. 14 is a diagram illustrating information stored in respective latches according to an embodiment of the present disclosure.

FIG. 14 illustrates information (1410) stored in latches before a verify operation for the fourth program state P4 passes, information (1420) stored in the latches after the verify operation for the fourth program state P4 passes, information (1430) stored in the latches after a verify operation for the fifth program state P5 passes, and information (1440) stored in the latches after a verify operation for the sixth program state P6 passes.

Data sensed from the bit line coupled to the memory cell and pre-charge data for determining a potential level to be pre-charged to the bit line in the pre-charge period may be stored in the first latch 1231.

The second latch 1232 may store pre-verify information on a pre-verify voltage until a verify operation for the sixth program state P6 passes, and may store main verify information on a main verify voltage after the verify operation for the sixth program state P6 passes.

The third latch 1233 may store main verify information and an LSB bit to be stored in the N-th page until the verify operation for the fourth program state P4 passes. In addition, when the verify operation for the fifth program state P5 passes, an LSB bit to be stored in the next page instead of the LSB bit previously stored in the third latch 1233 may be stored in the third latch 1233. In other words, a bit that is unnecessary to form the next program state, among the LSB bit, the CSB bit and the MSB bit, may be removed from a latch, and a bit to be stored in the next page may be input to that latch. The LSB bit and the main verify information previously stored in the third latch 1233 may be unnecessary after the verify operation for the fifth program state P5 passes. Therefore, the data previously stored in the third latch 1233 may be removed and an LSB bit to be stored in the (N+1)th page may be stored in the third latch 1233. The (N+1)th LSB bit stored in the third latch 1233 may correspond to data the fifth latch 1235 externally receives.

The fourth latch 1234 may store main verify information and a CSB bit to be stored in the N-th page until the verify operation for the fifth program state P5 passes. In addition, since the CSB bit stored in the fourth latch 1234 is unnecessary after the verify operation for the fifth program state P5 passes, the CSB bit may be removed from the fourth latch 1234. However, the main verify information on the N-th CSB bit stored in the fourth latch 1234 may be necessary even when the verify operation for the sixth program state P6 passes. More specifically, since a program loop is performed based on main verify information, even when the verify operation for the fifth program state P5 or the sixth program state P6 passes, the main verify information may be stored in the page buffer 1230. Therefore, the program operation controller 131 according to an embodiment may move the main verify information from the fourth latch 1234 to the second latch 1232. The program operation controller 131 may perform operations corresponding to a pre-charge period, a program period and a verify period.

The fifth latch 1235 may be coupled to the data line DL and receive data from an external device. More specifically, the fifth latch 1235 may receive the data from the memory controller 200 controlling the memory device 100. In addition, the fifth latch 1235 may store data to be stored in a page. More specifically, the fifth latch 1235 may store main verify information and an MSB bit to be stored in the N-th page until the verify operation for the fourth program state P4 passes. In addition, after the verify operation for the fourth program state P4 passes, the MSB bit which is unnecessary to form the next program state may be removed from the fifth latch 1235, and an LSB bit to be stored in the (N+1)th page may be input to the fifth latch 1235. After the verify operation for the fifth program state P5 passes, a CSB bit to be stored in the (N+1)th page may be input to the fifth latch 1235. After the verify operation for the sixth program state P6 passes, an MSB bit to be stored in the (N+1)th page may be input to the fifth latch 1235.

The order in which bits are input and/or moved, as well as the method of moving the bits are not limited to the specifics described in connection with FIG. 14. Other suitable orders and bit moving methods consistent with the teachings herein may be used.

Figure 15:
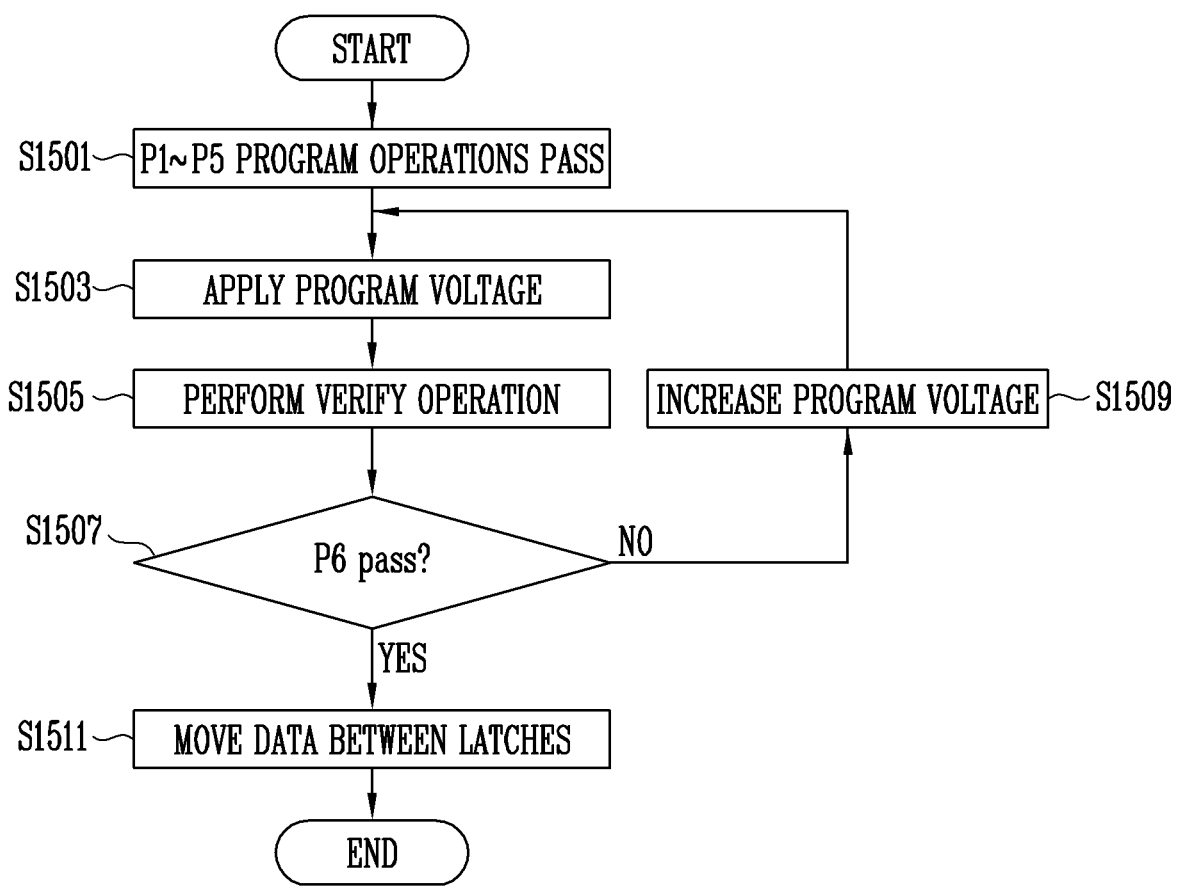
FIG. 15 is a flowchart illustrating a program operation of a memory device according to an embodiment of the present disclosure.

FIG. 15 is a flowchart illustrating a program operation of a memory device according to an embodiment of the present disclosure. By way of example, in FIG. 15, it is assumed that a memory cell operates as a triple level cell (TLC).

At operation S1501, program operations may be performed on memory cells having the first to fifth program states P1 to P5 as target program states. Each of the program operations may include at least one program loop. A single program loop may include a program voltage applying period and a verify period. More specifically, the program operation controller 131 may control the peripheral circuit 120 so that data temporarily stored in the page buffer group 123 may be programmed to the memory cell array 110. In addition, the program operation controller 131 may control the peripheral circuit 120 so that a program voltage may be applied to a selected word line during the program voltage applying period. In addition, the program operation controller 131 may determine whether a program operation for a program state passes or fails by applying a pre-verify voltage and a main verify voltage during the verify period of the program loop. The program operation controller 131 may receive the verify result from the sensing circuit 126, or may determine whether the program operation for the program state has passed or failed from one of the latches in the page buffer 1230 in the verify period. When the program operation is determined to have failed as a result of the verify operation, the next program loop may be performed by increasing the program voltage by a set step voltage Vstep. The verify operation may refer to an operation in which data stored in a memory cell is sensed using a pre-verify voltage or a main verify voltage. When the verify operation passes, it may mean that the verify operation on the pre-verify voltage or the main verify operation passes. When the verify operations on the memory cells having the first program state P1 to the fifth program state P5 as the target program states pass, the process flow may proceed to operation S1503.

At operation S1503, a program voltage may be applied to memory cells having the sixth program state P6 as the target program state. In another embodiment, the program voltage may be applied to a selected word line coupled to the memory cells having the sixth program state P6 or the seventh program state P7 as the target program state. While the program voltage is applied to the memory cell, a program permission voltage may be applied to the bit line coupled to the memory cell. More specifically, the program operation controller 131 may control the peripheral circuit 120 so that data temporarily stored in the page buffer group 123 may be programmed to the memory cell array 110. In addition, the program operation controller 131 may control the peripheral circuit 120 so that the program voltage may be applied to the selected word line.

At operation S1505, a verify operation may be performed on the memory cells having the sixth program state P6 as the target program state. More specifically, a pre-verify voltage or a main verify voltage corresponding to the sixth program state P6 may be applied to the selected word line.

At operation S1507, whether or not the sixth program operation has passed may be determined. Whether or not the program operation has passed may be determined based on a result of sensing the memory cells after the pre-verify voltage or the main very voltage is applied to the selected word line. More specifically, the program operation controller 131 may receive a verify result from the sensing circuit 126, or may receive verify information on whether a program operation for a program state has passed or failed so as to determine a result of the program operation for the sixth program state P6. When the program operation is determined to have failed, the process flow may proceed to operation S1509. When the program operation is determined to have passed, the process flow may proceed to operation S1511.

At operation S1509, when the program operation on the memory cells having the sixth program state P6 as the target program state is determined to have failed, the next program loop may be performed. In the next program loop, a program voltage which is increased by the set step voltage Vstep from the voltage applied to the selected word line in the previous program loop may be applied to the selected word line. Therefore, a higher program voltage may be applied to memory cells having relatively low program efficiency. The program operation controller 131 may repeat operations S1503, S1505 and S1507, increasing the program voltage by Vstep each iteration, until the verify operation for the sixth program state P6 passes.

At operation S1511, the program operation controller 131 may control the page buffer 1230 so that data may be moved between the plurality of latches in the page buffer 1230 before a program loop for the seventh program state P7 is performed. More specifically, the program operation controller 131 may control the page buffer 1230 by outputting the page buffer control signals PBSIGNALS. Subsequently, a program loop may be performed on memory cells having the seventh program state P7 as the target program state. When the program operation on the memory cells having the sixth program state P6 as the target program state is determined to have passed, the program operation controller 131 may apply a program inhibition voltage to bit lines coupled to the memory cells having the erase state E and the first to sixth program states P1 to P6 as the target program states. On the other hand, the program operation controller 131 may apply a program permission voltage to bit lines coupled to the memory cells having the seventh program state P7 as the target program state. In addition, the program operation controller 131 may skip a portion of a verify operation for the seventh program state P7 corresponding to the last program state. Particularly, the verify operation using the seventh pre-verify voltage Vpvf7 may be skipped. Since the verify operation using the pre-verify voltage is skipped, the time it takes to perform a subsequent program loop may be shortened and the program speed of the memory device 100 may be increased, thereby improving program efficiency.

Figure 16:
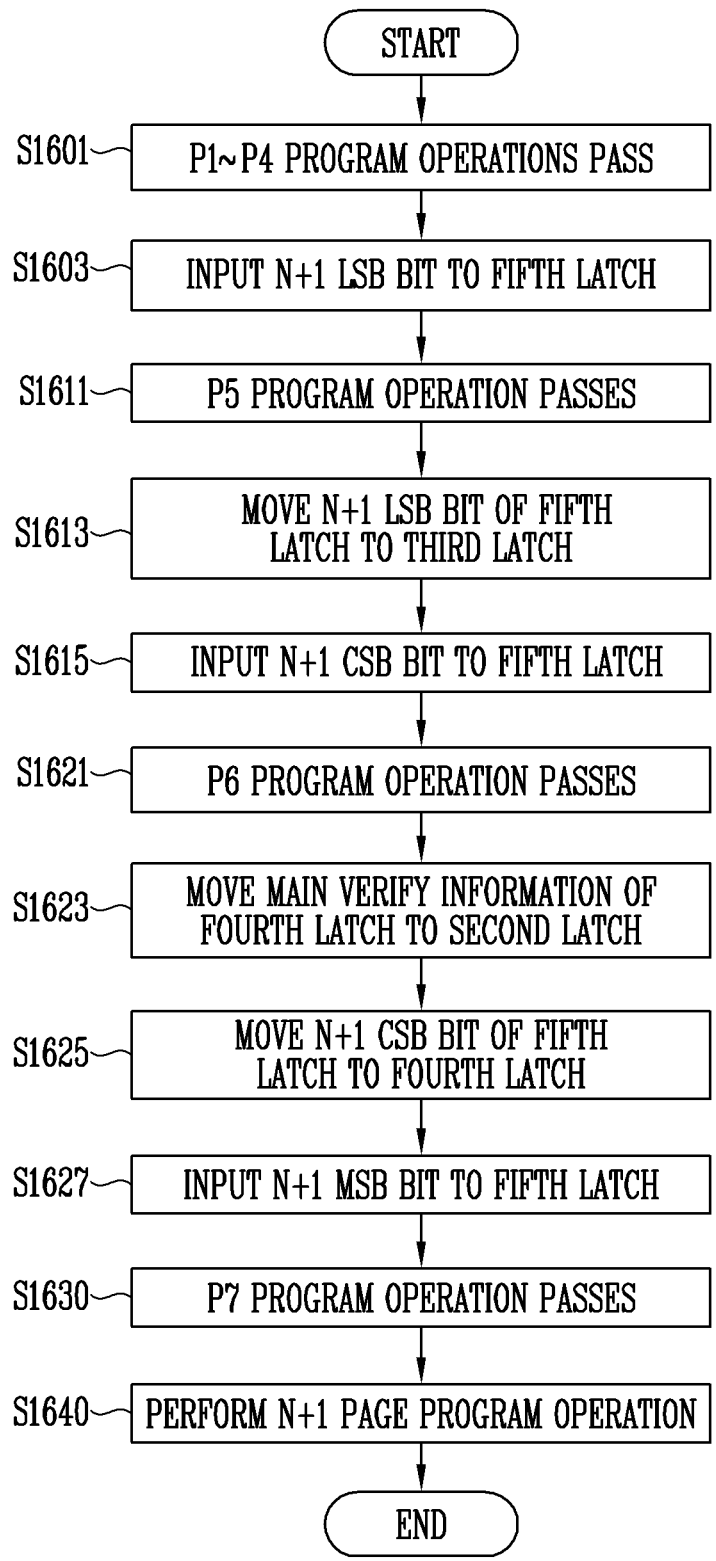
FIG. 16 is a flowchart illustrating an operating method of a memory device according to an embodiment of the present disclosure.

FIG. 16 is a flowchart illustrating an operating method of a memory device according to an embodiment of the present disclosure.

Referring to FIG. 16, at operation S1601, program operations may be performed on memory cells having the first to fourth program states P1 to P4 as target program states. Each of the program operations may include at least one program loop. A single program loop may include a program voltage applying period and a program verify period. More specifically, the program operation controller 131 may control the peripheral circuit 120 so that data temporarily stored in the page buffer group 123 may be programmed to the memory cell array 110. In addition, the program operation controller 131 may control the peripheral circuit 120 so that a program voltage may be applied to a selected word line during the program voltage applying period. In addition, the program operation controller 131 may determine whether the program state passes or fails by applying a pre-verify voltage and a main verify voltage during the verify period of the program loop. Alternatively, the program operation controller 131 may receive the verify result from the sensing circuit 126 or determine whether a program operation for a program state has passed or failed from one of the latches in the page buffer 1230 in the verify period. Before the program operation for the fourth program state P4 passes, main verify information and an LSB bit to be stored in the N-th page (hereinafter, an N-th LSB bit) may be stored in the third latch 1233, main verify information and a CSB bit to be stored in the N-th page (hereinafter, an N-th CSB bit) may be stored in the fourth latch 1234, and main verify information and an MSB bit to be stored in the N-th page (hereinafter, an N-th MSB bit) may be stored in the fifth latch 1235. In addition, when the verify operations on the memory cells having the first program state P1 to the fourth program state P4 as the target program states pass, the process flow may proceed to operation S1603.

At operation S1603, the program operation controller 131 may perform a reset operation of deleting the data stored in the fifth latch 1235 and may input data to be stored in the next page to the fifth latch 1235. For example, the N-th MSB bit and a main verify result may be stored in the fifth latch 1235. The program operation controller 131 may perform the reset operation of deleting the N-th MSB bit and the main verify information from the fifth latch 1235. The program operation controller 131 may externally receive an LSB bit to be stored in the (N+1)th page (hereinafter, an (N+1)th LSB bit) and may input the (N+1)th LSB bit to the fifth latch 1235.

At operation S1611, a program operation may be performed on memory cells having the fifth program state P5 as the target program state. As described above in connection with operation S1601, the program operation controller 131 may control the peripheral circuit 120 so that data temporarily stored in the page buffer group 123 may be programmed to the memory cell array 110. The program operation controller 131 may perform a verify operation based on whether or not the program operation for the fifth program state P5 has passed. When the program operation for the fifth program state P5 fails, the program operation controller 131 may perform the next loop by increasing the program voltage by a step voltage. In addition, the program operation controller 131 may perform a program loop until the program operation for the fifth program state P5 passes. When the verify operation on the memory cells having the fifth program state P5 as the target program state passes, the process flow may proceed to operation S1613.

At operation S1613, the program operation controller 131 may move the data stored in the fifth latch 1235 to the third latch 1233. More specifically, the fifth latch 1235 may store the (N+1)th LSB bit and the third latch 1233 may store the N-th LSB bit and the main verify information. The program operation controller 131 may move the (N+1)th LSB bit of the fifth latch 1235 to the third latch 1233. The program operation controller 131 may perform a reset operation of deleting the N-th LSB bit and the main verify information which are previously stored in the third latch 1233, and may move the (N+1)th LSB bit of the fifth latch 1235 to the third latch 1233.

At operation S1615, the program operation controller 131 may input externally received new data to the fifth latch 1235. More specifically, the program operation controller 131 may delete the (N+1)th LSB bit stored in the fifth latch 1235 and input the (N+1)th CSB bit to the fifth latch 1235. More specifically, the program operation controller 131 may perform a reset operation of deleting the (N+1)th LSB bit of the fifth latch 1235, and the program operation controller 131 may receive the CSB bit to be stored in the (N+1)th page and input the CSB bit to the fifth latch 1235.

At operation S1621, a program operation may be performed on the memory cells having the sixth program state P6 as the target program state. In addition, the program loop may be repeated until the verify operation on the memory cells having the sixth program state P6 as the target program state passes. When the verify operation on the memory cells having the sixth program state P6 as the target program state passes, the process flow may proceed to operation S1623.

At operation S1623, the program operation controller 131 may move the main verify information on the N-th CSB bit, stored in the fourth latch 1234, to the second latch 1232. The second latch 1232 may store pre-verify information until the verify operation for the sixth program state P6 passes. The pre-verify information may correspond to verify information on pass or fail in association with the pre-verify voltage having a lower potential level than the main verify voltage. In addition, the pre-verify information may include information indicating whether or not to apply the pre-verify voltage to the selected word line. According to an embodiment, the memory device 100 may not perform pre-verify for the seventh program state P7 which, in this example, is the highest program state for program performance. In other words, the pre-verify may be skipped without applying the pre-verify voltage for the pre-verify. The program operation controller 131 may perform a reset operation of deleting the pre-verify information stored in the second latch 1232 and move the main verify information on the seventh program state P7 from the fourth latch 1234 to the second latch 1232.

At operation S1625, the program operation controller 131 may move the (N+1)th CSB bit of the fifth latch 1235 to the fourth latch 1234. Since the main verify information on the seventh program state P7 previously stored in the fourth latch 1234 has already been moved to the second latch 1232 and the N-th CSB bit has not been further used after the verify operation for the sixth program state P6 passed, the program operation controller 131 may perform a reset operation of deleting the data stored in the fourth latch 1234. In addition, the program operation controller 131 may move the (N+1)th CSB bit of the fifth latch 1235 to the fourth latch 1234.

At operation S1627, the program operation controller 131 may input externally received new data to the fifth latch 1235. More specifically, the program operation controller 131 may control the peripheral circuit 120 so that a bit that is not yet stored in the page buffer 1230, among bits to be stored in the (N+1)th page, may be stored in the fifth latch 1235. For example, the program operation controller 131 may perform a reset operation of deleting the data stored in the fifth latch 1235 and input an MSB bit to be stored in the (N+1)th page in the fifth latch 1235.

Conventionally, since at least one latch is required to store verify information or a result of the verify operation for the sixth program state P6 even after the verify operation passes, the latch latching the verify information has to be reset after the verify operation for the seventh program state P7 passes. According to an embodiment, as a pre-verify operation for the seventh program state P7 is skipped and main verify information is stored in a latch storing verify information on the pre-verify operation for each of the first to sixth program states P1 to P6, performance of a cache program operation may be improved.

At operation S1630, the program operation controller 131 may start a program loop for forming the seventh program state P7. More specifically, in a pre-charge period, the program operation controller 131 may pre-charge a bit line of a memory cell to be programmed to the seventh program state P7 on the basis of the main verify information moved to the second latch 1232. The bit line of the memory cells having been programmed to the erase state E and the first to sixth program states P1 to P6 may be pre-charged to the program inhibition voltage. The program operation controller 131 may apply a program voltage for forming the seventh program state P7 to the selected word line in the program period. In addition, the program operation controller 131 may repeat a program loop of increasing the program voltage by a step voltage each iteration until the verify operation for the seventh program state P7 passes.

At operation S1640, the program operation controller 131 may perform a program operation so that the data stored in the page buffer 1230 to be stored in the (N+1)th page may be stored in the (N+1)th page.

Figure 17:
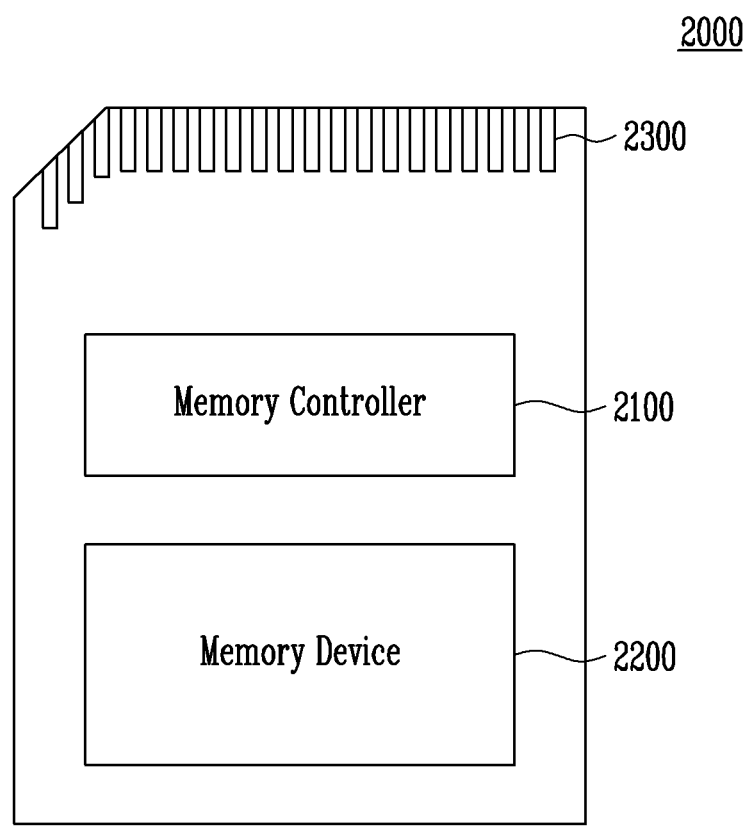
FIG. 17 is a diagram illustrating a memory card system according to an embodiment of the present disclosure.

FIG. 17 is a diagram illustrating a memory card system 2000 according to an embodiment of the present disclosure.

Referring to FIG. 17, the memory card system 2000 may include a memory controller 2100, a memory device 2200 and a connector 2300.

The memory controller 2100 may be electrically coupled to the memory device 2200. The memory controller 2100 may be configured to access the memory device 2200. For example, the memory controller 2100 may control read, write, erase, and background operations of the memory device 2200. The memory controller 2100 may be configured to provide an interface between the memory device 2200 and a host. In addition, the memory controller 2100 may be configured to drive firmware for controlling the memory device 2200.

For example, the memory controller 2100 may include components, such as a Random Access Memory (RAM), a processor, a host interface, a memory interface, and an ECC component.

The memory controller 2100 may communicate with an external device through the connector 2300. The memory controller 2100 may communicate with an external device (e.g., host) based on a specific communication protocol. For example, the memory controller 2100 may communicate with the external device through at least one of various communication protocols, such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) protocols. For example, the connector 2300 may be defined by at least one of the above-described various communication protocols.

In an embodiment, the memory device 2200 may be embodied as any of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin-Torque Magnetic RAM (STT-MRAM).

The memory controller 2100 and the memory device 2200 may be integrated into a single semiconductor device to form a memory card, such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), and/or a universal flash storage (UFS).

Figure 18:
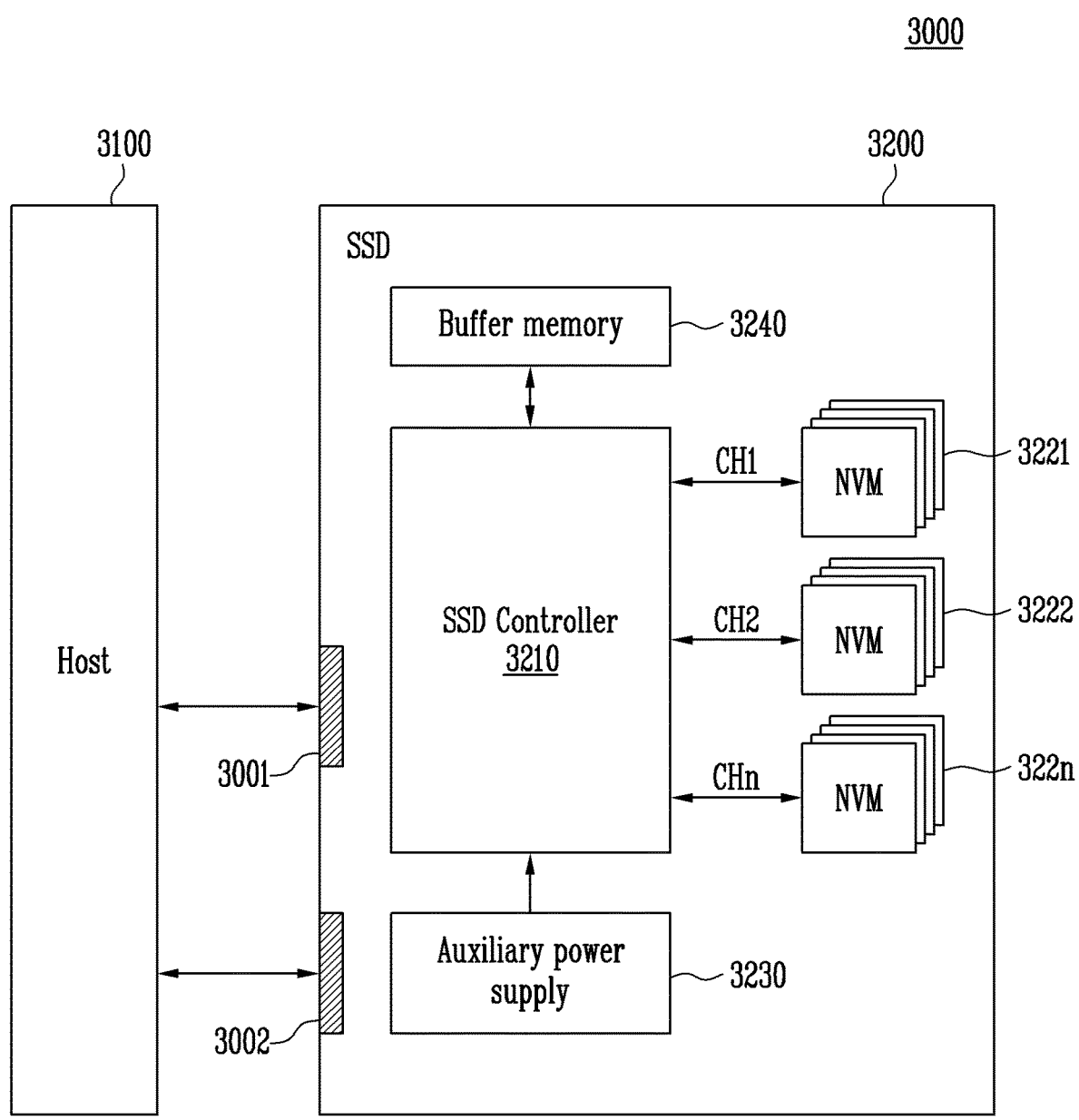
FIG. 18 is a diagram illustrating a solid state drive (SSD) system according to an embodiment of the present disclosure.

FIG. 18 is a diagram illustrating a solid state drive (SSD) system 3000 according to an embodiment of the present disclosure.

Referring to FIG. 18, the SSD system 3000 may include a host 3100 and an SSD 3200. The SSD 3200 may exchange signals SIG with the host 3100 through a signal connector 3001 and may receive power PWR through a power connector 3002. The SSD 3200 may include an SSD controller 3210, a plurality of flash memories 3221 to 322n, an auxiliary power supply 3230, and a buffer memory 3240.

According to an embodiment, the SSD controller 3210 may perform the function of the memory controller 200 described above with reference to FIG. 1. The SSD controller 3210 may control the plurality of flash memories 3221 to 322n in response to the signals SIG received from the host 3100. For example, the signals SIG may be based on the interfaces of the host 3100 and the SSD 3200. For example, the signals SIG may be defined by at least one of various interfaces such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), WiFi, Bluetooth, and/or nonvolatile memory express (NVMe) interfaces.

The auxiliary power supply 3230 may be coupled to the host 3100 through the power connector 3002. The auxiliary power supply 3230 may be supplied and charged with the power PWR from the host 3100. The auxiliary power supply 3230 may supply the power of the SSD 3200 when power is not smoothly supplied from the host 3100. According to an embodiment, the auxiliary power supply 3230 may be disposed within or external to the SSD 3200. For example, the auxiliary power supply 3230 may be disposed in a main board and may supply auxiliary power to the SSD 3200.

The buffer memory 3240 may function as a buffer memory of the SSD 3200. For example, the buffer memory 3240 may temporarily store data received from the host 3100 or data received from the plurality of flash memories 3221 to 322n, or may temporarily store metadata (e.g., mapping tables) of the flash memories 3221 to 322n. The buffer memory 3240 may include volatile memories such as DRAM, SDRAM, DDR SDRAM, LPDDR SDRAM, and GRAM or nonvolatile memories such as FRAM, ReRAM, STT-MRAM, and PRAM.

Figure 19:
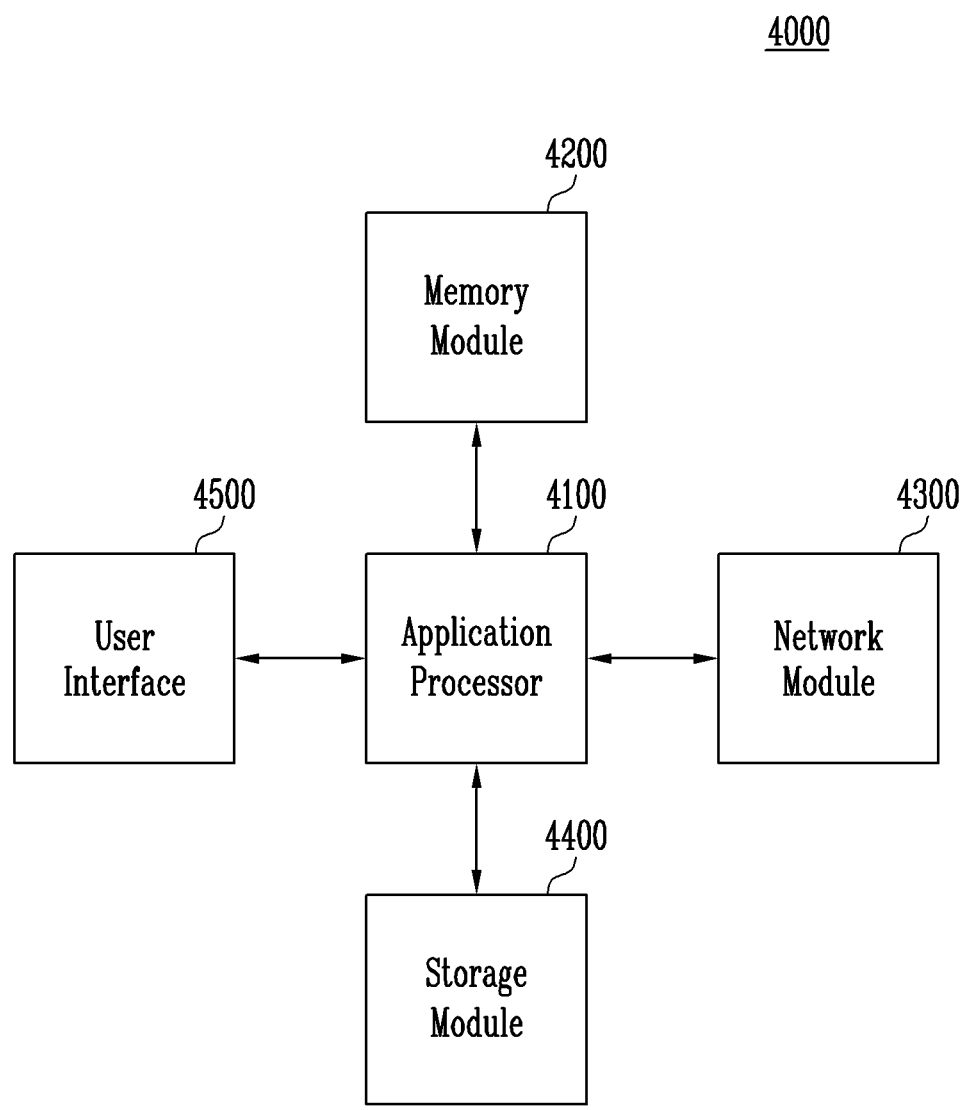
FIG. 19 is a diagram illustrating a user system according to an embodiment of the present disclosure.

FIG. 19 is a diagram illustrating a user system 4000 according to an embodiment of the present disclosure.

Referring to FIG. 19, the user system 4000 may include an application processor 4100, a memory module 4200, a network module 4300, a storage module 4400, and a user interface 4500.

The application processor 4100 may run components included in the user system 4000, an operating system (OS), or a user program. For example, the application processor 4100 may include controllers, interfaces, graphic engines, etc. for controlling the components included in the user system 4000. The application processor 4100 may be provided as a system-on-chip (SoC).

The memory module 4200 may function as a main memory, a working memory, a buffer memory, or a cache memory of the user system 4000. The memory module 4200 may include any of various volatile RAMs such as DRAM, SDRAM, DDR SDRAM, DDR2 SDRAM, DDR3 SDRAM, LPDDR SDRAM, LPDDR2 SDRAM, and LPDDR3 SDRAM, or any of various nonvolatile RAMs such as PRAM, ReRAM, MRAM, and FRAM. For example, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), Wimax, WLAN, UWB, Bluetooth, or WiFi communication. For example, the network module 4300 may be included in the application processor 4100.

The storage module 4400 may store data. For example, the storage module 4400 may store data received from the application processor 4100. Alternatively, the storage module 4400 may transmit the data stored in the storage module 4400 to the application processor 4100. For example, the storage module 4400 may be embodied as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. For example, the storage module 4400 may be provided as a removable storage medium (i.e., removable drive), such as a memory card or an external drive of the user system 4000.

For example, the storage module 4400 may include a plurality of nonvolatile memory devices, each of which may be operated in the same manner as the memory device described above with reference to FIGS. 11 to 16. The storage module 4400 may operate in the same manner as the storage device 1000 described above with reference to FIG. 1.

The user interface 4500 may include interfaces which input data or instructions to the application processor 4100 or output data to an external device. According to an embodiment, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces such as a Liquid Crystal Display (LCD), an Organic Light Emitting Diode (OLED) display device, an Active Matrix OLED (AMOLED) display device, an LED, a speaker, and a monitor.

Embodiments of the present disclosure provide a memory device including a cache latch and a method of controlling the memory device. The memory device may perform an improved cache program operation.

In the above-discussed embodiments, not all steps necessarily need to be performed. In addition, not all steps necessarily need to be performed in the disclosed order. More generally, the disclosed embodiments aim to help those with ordinary knowledge in this art more clearly understand the present invention, not to limit it. In other words, those skilled in the art will understand from the present disclosure that various modifications are possible based on the technical details provided herein. Thus, the present invention encompasses all such modifications that fall within the scope of the appended claims and their equivalents.

What is claimed is:

1. A memory device comprising:
a plurality of memory cells coupled to a selected word line and to be programmed to one of first to n-th program states distinguished from each other based on threshold voltages thereof, where n is a natural number greater than 1;
a sensing latch storing data sensed from a bit line coupled to one memory cell among the plurality of memory cells;
a pre-latch storing pre-verify information indicating whether or not to apply a pre-verify voltage having a lower potential level than a main verify voltage to the selected word line during verify operations for the first to n-th program states; and
a plurality of data latches storing data to be stored in the one memory cell,
wherein at least one data latch among the plurality of data latches stores main verify information on the main verify voltage during verify operations for the first program state to a threshold program state among the first to n-th program states until the verify operation for the threshold program state passes, and
wherein the pre-latch stores the main verify information on the n-th program state after the verify operation for the threshold program state passes.

2. The memory device of claim 1, further comprising:
a program state determiner determining whether a threshold voltage of the one memory cell has reached the threshold program state; and
a page buffer controller moving data between the plurality of data latches.

3. The memory device of claim 2, wherein the page buffer controller moves data stored in a data latch receiving data from an external device, among the plurality of data latches, to another data latch when the verify operation for the threshold program state passes.

4. The memory device of claim 2, wherein the page buffer controller moves the main verify information stored in one of the plurality of data latches to the pre-latch when the verify operation for the threshold program state passes.

5. The memory device of claim 1, wherein the plurality of data latches store subsequent data to be stored in a subsequent memory cell selected after the one memory cell after the verify operation for the threshold program state passes.

6. The memory device of claim 5, wherein the subsequent data is programmed to the subsequent memory cell when the verify operation for the n-th program state passes.

7. The memory device of claim 1, wherein the threshold program state is an (n−1)th program state among the first to n-th program states.

8. The memory device of claim 1, wherein one data latch, among the plurality of data latches, is a cache latch receiving data from a memory controller controlling the memory device.

9. The memory device of claim 1,
wherein the plurality of memory cells are to be programmed to one of the first to n-th program states through a plurality of program loops, and
wherein each of the plurality of program loop includes a pre-charge period for pre-charging a bit line coupled to the one memory cell and a sensing period for sensing a potential of the bit line.

10. The memory device of claim 9, wherein the sensing latch stores pre-charge data for determining a potential to which the bit line is to be pre-charged in the pre-charge period.

11. A memory device, comprising:
a plurality of memory cells coupled to a selected word line and to be programmed to one of first to n-th program states distinguished from each other based on threshold voltages thereof, where n is a natural number greater than 1;

a sensing latch storing data sensed from a bit line coupled to one memory cell among the plurality of memory cells;

a pre-latch storing pre-verify information indicating whether or not to apply a pre-verify voltage having a lower potential level than a main verify voltage to the selected word line during verify operations for the first to n-th program states;

a plurality of data latches storing data to be stored in the one memory cell; and a control logic storing, in at least one data latch among the plurality of data latches, main verify information on the main verify voltage during verify operations for the first program state to a threshold program state among the first to n-th program states until the verify operation for the threshold program state passes and storing, in the pre-latch, the main verify information on the n-th program state after the verify operation for the threshold program state passes.

12. The memory device of claim 11, wherein the control logic moves data between the plurality of data latches and the pre-latch.

13. The memory device of claim 12, wherein the control logic moves data stored in a data latch receiving data from an external device, among the plurality of data latches, to another data latch when the verify operation for the threshold program state passes.

14. The memory device of claim 12, wherein the control logic moves the main verify information stored in one of the plurality of data latches to the pre-latch when the verify operation for the threshold program state passes.

15. The memory device of claim 11, wherein the control logic stores, in the plurality of data latches, subsequent data to be stored in a subsequent memory cell selected after the one memory cell after the verify operation for the threshold program state passes.

16. The memory device of claim 15, wherein the subsequent data is programmed to the subsequent memory cell when the verify operation for the n-th program state passes.

17. The memory device of claim 11, wherein the threshold program state is an (n−1)th program state among the first to n-th program states.

18. The memory device of claim 11, wherein at least one data latch, among the plurality of data latches, is a cache latch receiving data from a memory controller controlling the memory device.

19. The memory device of claim 11,
wherein the plurality of memory cells are to be programmed to one of the first to n-th program states through a plurality of program loops, and
wherein each of the plurality of program loop includes a pre-charge period for pre-charging a bit line coupled to the one memory cell and a sensing period for sensing a potential of the bit line.

20. An operating method of a memory device, the operating method comprising:
latching, in a pre-latch, pre-verify information on first to (n−1)th program states of memory cells during a pre-verify operation for the first to (n−1)th program states of the memory cells;
latching, in one or more data latches, main verify information on the first to (n−1)th program states until a main verify operation for the first to (n−1)th program states passes,
latching, in the pre-latch, the main verify information on the n-th program state during the main verify operation for the n-th program state without performing the pre-verify operation for the n-th program state after the main verify operation for the first to (n−1)th program states passes, and
pre-charging one or more bit lines coupled to the memory cells based on the main verify information latched in the pre-latch,
wherein the memory cells are coupled to a word line and to be programmed to the first to n-th program states.

* * * * *